(12) United States Patent
Sawachi et al.

(10) Patent No.: US 12,377,503 B2
(45) Date of Patent: *Aug. 5, 2025

(54) PART REPLACEMENT SYSTEM AND PART REPLACEMENT DEVICE

(71) Applicant: Tokyo Electron Limited, Tokyo (JP)

(72) Inventors: Atsushi Sawachi, Miyagi (JP); Ichiro Sone, Miyagi (JP); Suguru Sato, Miyagi (JP); Takuya Nishijima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/638,830

(22) Filed: Apr. 18, 2024

(65) Prior Publication Data

US 2024/0261918 A1 Aug. 8, 2024

Related U.S. Application Data

(63) Continuation of application No. 17/246,238, filed on Apr. 30, 2021, now Pat. No. 11,992,912.

(30) Foreign Application Priority Data

May 1, 2020 (JP) ................................. 2020-081411

(51) Int. Cl.
*B23Q 3/155* (2006.01)
*H01L 21/687* (2006.01)

(52) U.S. Cl.
CPC ...... *B23Q 3/1556* (2013.01); *H01L 21/68785* (2013.01)

(58) Field of Classification Search
CPC ............ B23Q 3/1556; H01L 21/68785; H01L 21/6719; H01L 21/67196; H01L 21/67724; H01L 21/67769; H01L 21/67739; H01L 21/67742
See application file for complete search history.

(56) References Cited

U.S. PATENT DOCUMENTS

2005/0205209 A1   9/2005  Mosden
2017/0115657 A1   4/2017  Trussell et al.

FOREIGN PATENT DOCUMENTS

JP      2017-085072 A    5/2017

*Primary Examiner* — Christopher J. Besler
(74) *Attorney, Agent, or Firm* — XSENSUS LLP

(57) ABSTRACT

A part replacement system includes a part storage device configured to store an unused consumable part, and a replacement device that is connected to a processing device and the part storage device, the replacement device being configured to replace a used consumable part installed in the processing device with the unused consumable part stored in the part storage device. The replacement device is moved to a position of the processing device having the used consumable part that requires replacement, and the replacement device is connected to the processing device, and the part storage device is moved to a position of the replacement device connected to the processing device having the used consumable part that requires replacement, and the part storage device is connected to the replacement device.

18 Claims, 19 Drawing Sheets

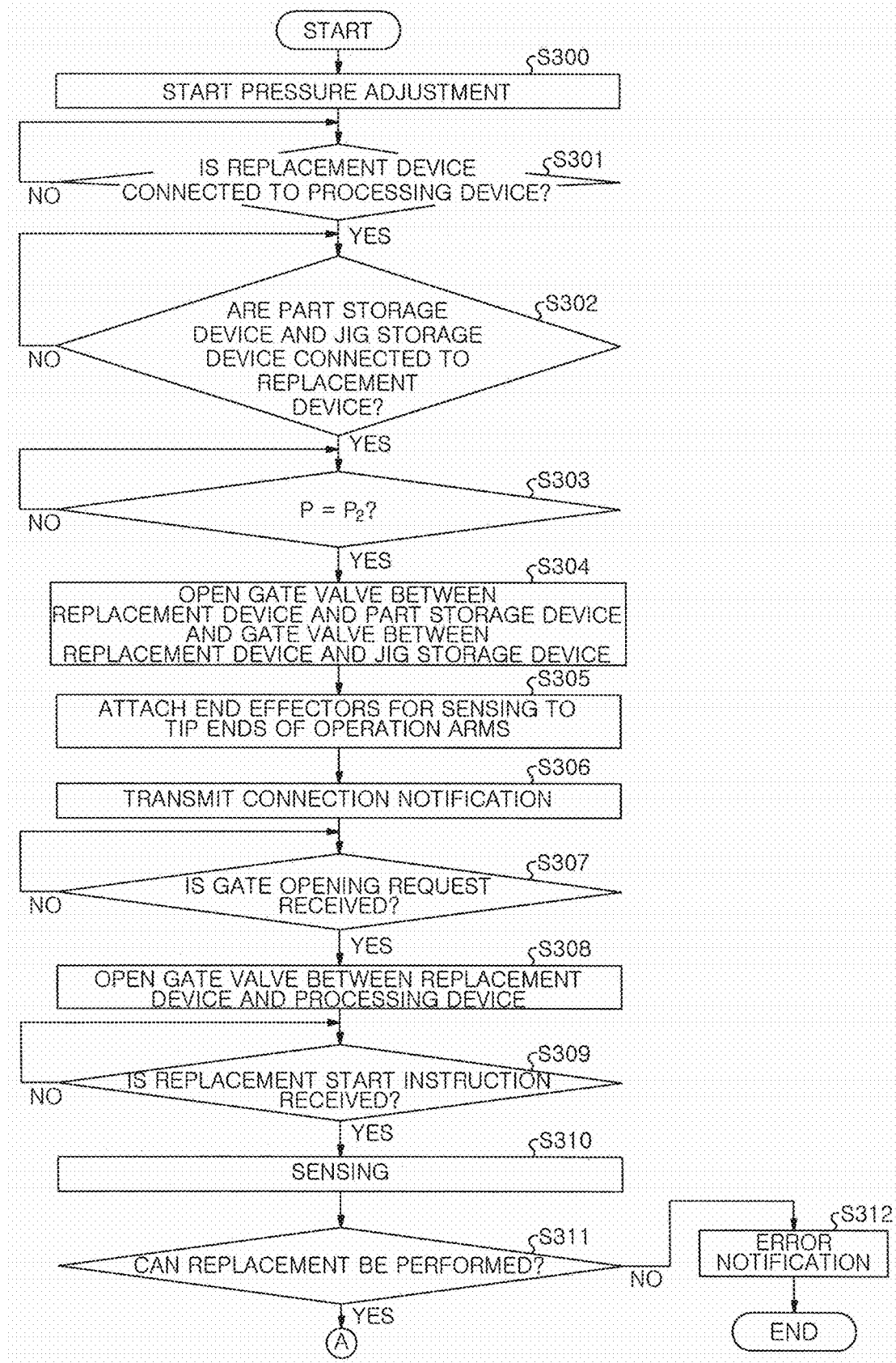

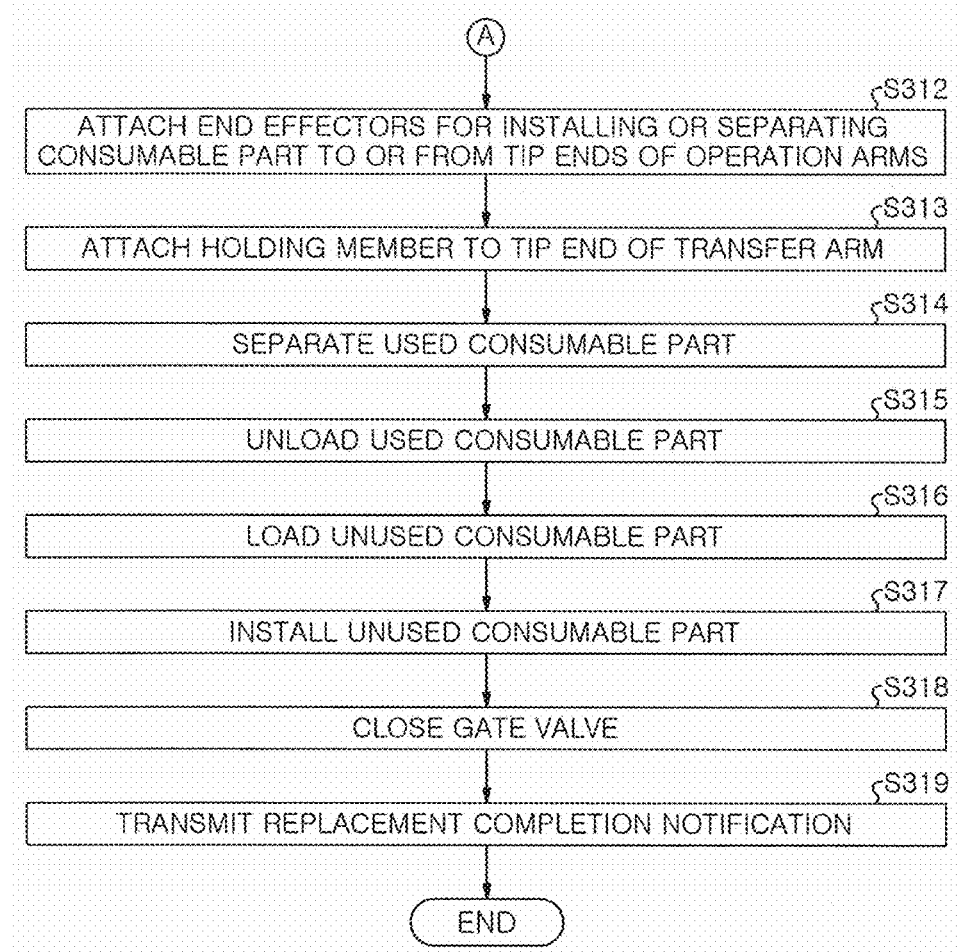

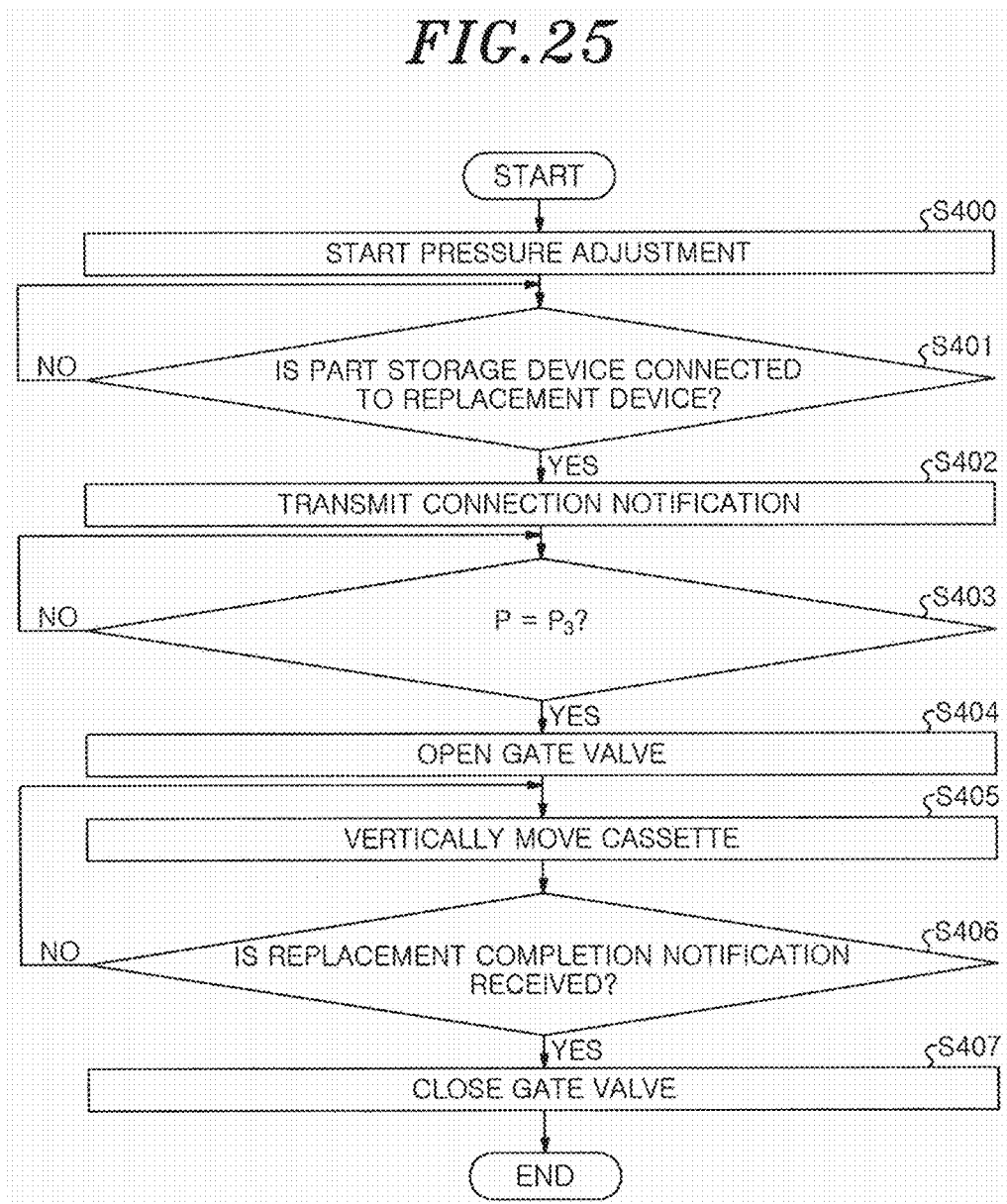

PART REPLACEMENT SYSTEM AND PART REPLACEMENT DEVICE

CROSS-REFERENCE TO RELATED APPLICATIONS

This application is a continuation of U.S. patent application Ser. No. 17/246,238, filed on Apr. 30, 2021, which claims priority to Japanese Patent Application No. 2020-081411, filed on May 1, 2020, the entire contents of each are incorporated herein by reference.

TECHNICAL FIELD

Various aspects and embodiments of the present disclosure relate to a part replacement system and a part replacement device.

BACKGROUND

Inside a processing device for processing a substrate, there are consumable parts that are consumed as the substrate is processed. The consumable parts are replaced with unused consumable parts when a consumption amount of each of the consumable parts exceeds a predetermined consumption amount. In the replacement of the consumable part, processing of the substrate in the processing device is stopped, and a container of the processing device is opened to the atmosphere. Then, a used consumable part is manually extracted, and an unused consumable part is manually installed. Then, the container is closed and the inside of the container is evacuated. Then, the processing of the substrate is restarted.

As described above, since the processing device is opened to the atmosphere when the consumable part is replaced, it is necessary to evacuate the processing device after the consumable part is replaced, which increases a processing stop time period. In addition, since there is a large-sized consumable part, a long period of time may be required to manually replace such a large-sized consumable part.

In view of the above, there is known a replacement station having a replacement handler for replacing a used consumable part with an unused consumable part (see, e.g., Japanese Patent Application Publication No. 2017-85072). In the replacement station, a processing device and the replacement station are connected to each other, and a shutoff valve between the processing device and the replacement station is opened after the replacement station is vacuum-evacuated. Then, the used consumable part is extracted from the processing device by the replacement handler in the replacement station and replaced with the unused consumable part installed in the replacement station. Accordingly, the consumable part may be replaced without opening the inside of the processing device to the atmosphere, and thus the processing stop time period may be shortened. In addition, since the consumable part is replaced by the replacement handler instead of being replaced manually, the consumable part may be quickly replaced.

SUMMARY

The present disclosure provides a part replacement system and a part replacement device capable of reducing an installation area of a system in manufacturing semiconductor devices.

In accordance with an aspect of the present disclosure, there is provide a system that replaces a used consumable part with an unused consumable part, the system comprising: a part storage device configured to store the unused consumable part; and a replacement device that is connected to a processing device and the part storage device, the replacement device being configured to replace the used consumable part installed in the processing device with the unused consumable part stored in the part storage device. Further, the replacement device is moved to a position of the processing device having the used consumable part that requires replacement, the replacement device is connected to the processing device, the part storage device is moved to a position of the replacement device connected to the processing device having the used consumable part that requires replacement, and the part storage device is connected to the replacement device.

BRIEF DESCRIPTION OF THE DRAWINGS

The objects and features of the present disclosure will become apparent from the following description of embodiments, given in conjunction with the accompanying drawings, in which:

FIGS. 23 and 24 are flowcharts showing an example of processing of the replacement device; and FIG. 25 is a flowchart showing an example of processing of the part storage device and the jig storage device.

DETAILED DESCRIPTION

Hereinafter, exemplary embodiments of a part replacement system and a replacement device (part replacement device) will be described in detail with reference to the accompanying drawings. The following embodiments are not intended to limit the part replacement system and the replacement device of the present disclosure.

In a mass production process of a product, since a substrate is processed by a plurality of processing devices, consumable parts are replaced in the processing devices that are installed at different locations. Therefore, a replacement station having an unused consumable part(s) needs to be moved to a location of the processing device where the replacement of a consumable part is required.

In a case where only a single unused consumable part is stored in the replacement station, when the replacement station completes the replacement of the consumable part, a next replacement operation cannot be started until a new unused consumable part is replenished therein. Therefore, the processing device having a consumable part that requires replacement needs to stop the processing until the consumable part is replaced. This results in the decrease of a processing throughput. On the other hand, in a case where a plurality of unused consumable parts is stored in the replacement station, the replacement of the consumable part can be consecutively performed until there are no more unused consumable parts. Accordingly, it is possible to suppress the decrease of the processing throughput.

However, as the number of consumable parts stored in the replacement station increases, the replacement station is scaled up in size. Therefore, a width of a passage through which the replacement station moves needs to be widened, and an installation area of an entire system in manufacturing the semiconductor devices increases.

Accordingly, the present disclosure provides a technique capable of reducing the installation area of the system in manufacturing the semiconductor devices.

(Configuration of Manufacturing System 10)

Figure 1:
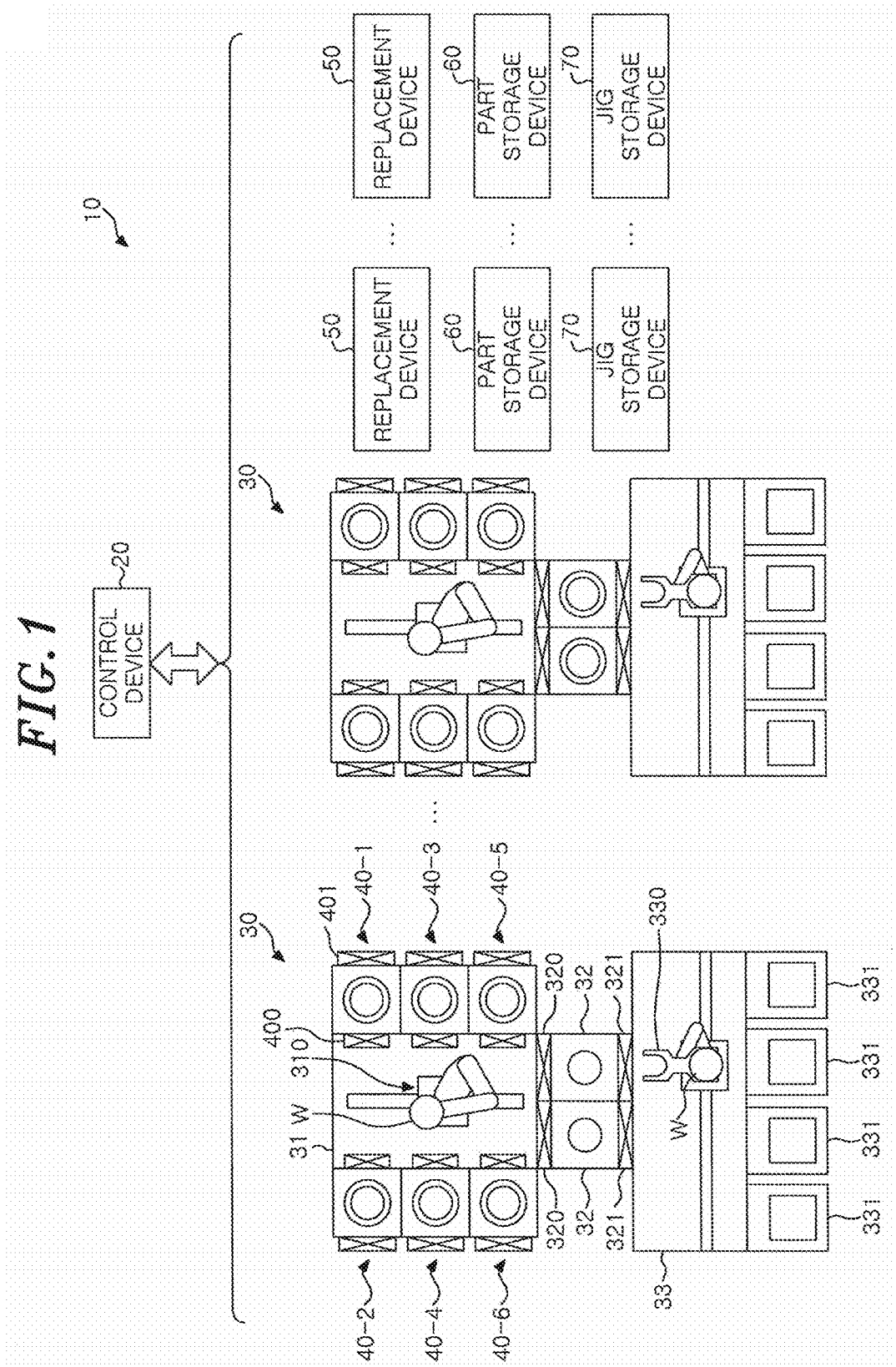
FIG. 1 is a system configuration diagram showing an example of a manufacturing system according to an embodiment of the present disclosure.

FIG. 1 is a system configuration diagram showing an example of a manufacturing system 10 according to an embodiment of the present disclosure. The manufacturing system 10 is an example of a part replacement system. In one embodiment, the manufacturing system 10 includes a control device 20, a plurality of processing groups 30, a plurality of replacement devices 50, a plurality of part storage devices 60, and a plurality of jig storage devices 70. The control device 20 communicates with each processing group 30, each replacement device 50, each part storage device 60, and each jig storage device 70 so as to control each processing group 30, each replacement device 50, each part storage device 60, and each jig storage device 70.

Each of the processing groups 30 has a vacuum transfer chamber 31, a plurality of processing devices 40-1 to 40-6, a plurality of load-lock chambers 32, and an atmospheric transfer chamber 33. In the following description, the processing devices 40-1 to 40-6 will be collectively referred to as "processing devices 40" unless otherwise stated.

The processing devices 40 and the load-lock chambers 32 are connected to the vacuum transfer chamber 31. In the present embodiment, six processing devices 40 are connected to the vacuum transfer chamber 31. However, five or less processing devices 40 may be connected to the vacuum transfer chamber 31, or seven or more processing devices 40 may be connected to the vacuum transfer chamber 31. Further, in the present embodiment, two load-lock chambers 32 are connected to the vacuum transfer chamber 31. However, one load-lock chamber 32 may be connected to the vacuum transfer chamber 31, or three or more load-lock chambers 32 may be connected to the vacuum transfer chamber 31.

Each of the processing devices 40 performs processing such as etching or film formation on the substrate W in a low-pressure environment, for example. Consumable parts that are consumed as the substrate W is processed are disposed in each of the processing devices 40. The processing devices 40 are partitioned from the vacuum transfer chamber 31 by corresponding gate valves 400. Further, each of the processing devices 40 includes a gate valve 401 for unloading a used consumable part and loading an unused consumable part. The processing devices 40 may perform the same process or different processes in the manufacturing process.

Each of the load-lock chambers 32 includes gate valves 320 and 321 so that a pressure therein can be switched from a predetermined vacuum level to an atmospheric pressure or from an atmospheric pressure to the predetermined vacuum level. The load-lock chambers 32 are partitioned from the vacuum transfer chamber 31 by the corresponding gate valves 320. Further, the load-lock chambers 32 are partitioned from the atmospheric transfer chamber 33 by the corresponding gate valves 321.

A robot arm 310 is disposed in the vacuum transfer chamber 31. The pressure in the vacuum transfer chamber 31 is maintained at a predetermined vacuum level. In the present embodiment, the robot arm 310 extracts an unprocessed substrate W from the load-lock chamber 32 that is decompressed to a predetermined vacuum level and transfers the unprocessed substrate W into one of the processing devices 40. Further, the robot arm 310 extracts a processed substrate W from the processing device 40 and transfers the processed substrate W into another processing device 40 or the load-lock chamber 32.

A robot arm 330 is disposed in the atmospheric transfer chamber 33. Further, the atmospheric transfer chamber 33 includes a plurality of load ports 331 to each of which a container (e.g., Front Opening Unified Pod (FOUP)) capable of accommodating a plurality of unprocessed and/or processed substrates W. The robot arm 330 extracts an unprocessed substrate W from the container connected to the load port 331 and transfers the unprocessed substrate W into the load-lock chamber 32. Further, the robot arm 330 extracts a processed substrate W from the load-lock chamber 32 and transfers the processed substrate W into the container connected to the load port 331. The atmospheric transfer chamber 33 may include an alignment unit for adjusting an orientation of the substrate W taken out from the container connected to the load port 331.

Each of the replacement devices 50 includes a robot arm and a mover (moving mechanism) for replacing a consumable part. Each of the replacement devices 50 is moved to a position of the processing device 40 having a consumable part that requires replacement in response to an instruction from the control device 20, and then is connected to the processing device 40 having the consumable part. Each of the part storage devices 60 includes a plurality of unused consumable parts and a mover. Each of the part storage devices 60 is moved to a position of the replacement device 50 connected to the processing device 40 having the consumable part that requires replacement in response to an instruction from the control device 20, and then is connected to the replacement device 50. Each of the jig storage devices 70 includes a jig and a mover for replacing a consumable part. Each of the jig storage devices 70 is moved to a position of the replacement device 50 connected to the processing device 40 having the consumable part that requires replacement in response to an instruction from the control device 20, and then is connected to the replacement device 50.

The robot arm of the replacement device 50 extracts a jig for replacing a consumable part from the jig storage device 70. Then, the robot arm of the replacement device 50 separates a used consumable part from the processing device 4 using the jig, and accommodates the separated consumable part in the part storage device 60. Then, the robot arm of the replacement device 50 extracts an unused consumable part from the part storage device 60, and installs the unused consumable part in the processing device 40. In such a manner, the used consumable part and the unused consumable part are replaced in the processing device 40.

As described above, in the manufacturing system 10 of the present embodiment, the replacement device 50 for replacing a consumable part and the part storage device 60 having a plurality of consumable parts are moved to the position of the processing device 40 having a consumable part that requires replacement. Therefore, the replacement device 50 and the part storage device 60 can be scaled down in size compared to the replacement station provided with the replacement device 50 and the part storage device 60.

Accordingly, the width of the passage through which the replacement device 50 and the part storage device 60 move can be reduced and, further, the installation area of the entire manufacturing system 10 can be reduced.

(Configuration of Processing Device 40)

Figure 2:
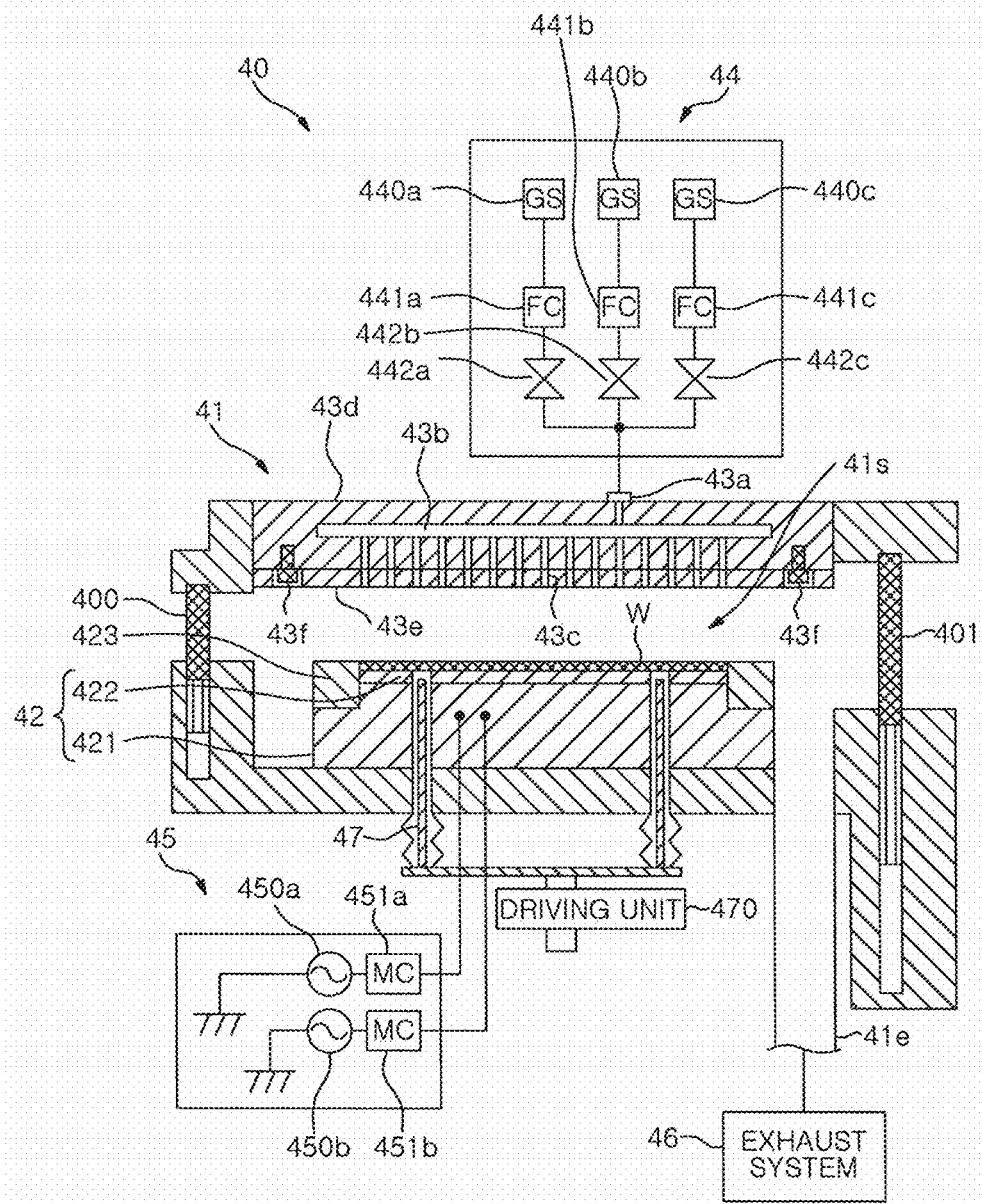
FIG. 2 is a schematic cross-sectional view showing an example of a processing device.

FIG. 2 is a schematic cross-sectional view showing an example of the processing device 40. In the present embodiment, the processing device 40 includes a chamber 41, a gas supply unit 44, a radio frequency (RF) power supply unit 45, and an exhaust system 46.

The chamber 41 has a support unit 42 and an upper electrode shower head assembly 43. The support unit 42 is disposed in a lower region of a processing space 41s in the chamber 41. The upper electrode shower head assembly 43 is disposed above the support unit 42 and may function as a part of a ceiling plate of the chamber 41.

The support unit 42 is configured to support the substrate W in the processing space 41s. In the present embodiment, the support unit 42 includes a lower electrode 421 and an electrostatic chuck 422. The electrostatic chuck 422 is disposed on the lower electrode 421 and is configured to support the substrate W on the upper surface of the electrostatic chuck 422. An edge ring 423 is provided on an upper surface of a peripheral portion of the lower electrode 421. The edge ring 423 is disposed to surround the electrostatic chuck 422 and the substrate W on the upper surface of the peripheral portion of the lower electrode 421. The edge ring 423 is an example of a consumable part.

Through-holes through which lift pins 47 pass are formed through a bottom portion of the chamber 41, the lower electrode 421, and the electrostatic chuck 422. The lift pins 47 are vertically moved by a driving unit (DU) 470 when the substrate W is loaded and unloaded. Accordingly, an unprocessed substrate W loaded into the chamber 41 may be received from the robot arm 310 and placed on the electrostatic chuck 422, and a processed substrate W can be transferred to the robot arm 310 and unloaded from the chamber 41.

The upper electrode shower head assembly 43 is configured to supply one or more types of gases from a gas supply unit 44 into the processing space 41s. In the present embodiment, the upper electrode shower head assembly 43 includes an electrode holder 43d and an upper electrode 43e. The upper electrode 43e is fixed to the electrode holder 43d by a fixing member 43f such as a screw. The electrode holder 43d has a gas inlet 43a and a gas diffusion space 43b. The gas supply unit 44 and the gas diffusion space 43b are in fluid-communication with each other through the gas inlet 43a.

A plurality of gas outlets 43c are formed in the electrode holder 43d and the upper electrode 43e. The gas diffusion space 43b and the processing space 41s are in fluid-communication with each other through the gas outlets 43c. In the present embodiment, the upper electrode shower head assembly 43 is configured to supply one or more types of gases from the gas inlet 43a into the processing space 41s through the gas diffusion space 43b and the gas outlets 43c.

The gas supply unit 44 may include a plurality of gas sources (GS) 440a to 440c, a plurality of flow controllers (FC) 441a to 441c, and a plurality of valves 442a to 442c. For example, the gas source 440a is a source of a processing gas, the gas source 440b is a source of a cleaning gas, and the gas source 440c is a source of an inert gas. In the present embodiment, the inert gas is, for example, nitrogen gas. Each of the flow controllers 441a to 441c may include, for example, a mass flow controller or a pressure-control type flow controller. Further, the gas supply unit 44 may include one or more flow modulation devices for modulating or pulsating the gas flows of one or more processing gases.

The RF power supply unit 45 is configured to supply an RF power, for example, one or more RF signals, to one or more electrodes, i.e., either one or both of the lower electrode 421 and the upper electrode showerhead assembly 43. In the present embodiment, the RF power supply unit 45 includes two RF generators 450a and 450b and two matching circuits (MC) 451a and 451b. In the present embodiment, the RF power supply unit 45 is configured to supply a first RF signal from the RF generator 450a to the lower electrode 421 through the matching circuit 451a. An RF spectrum includes a part of an electromagnetic spectrum ranging from 3 Hz to 3000 GHz. In an electronic material process such as a semiconductor process, the frequency of the RF spectrum used for plasma generation is preferably within a range of 100 kHz to 3 GHz, and more preferably within a range of 200 kHz to 150 MHz. For example, the frequency of the first RF signal may be within a range of 27 MHz to 100 MHz.

Further, the RF power supply unit 45 of the present embodiment is configured to supply a second RF signal from the RF generator 450b to the lower electrode 421 through the matching circuit 451b. For example, the frequency of the second RF signal may be within a range of 400 kHz to 13.56 MHz. Alternatively, the RF power supply unit 45 may have a direct current (DC) pulse generator, instead of the RF generator 450b.

Although it is not illustrated, other embodiments of the present disclosure may be considered. For example, in an alternative embodiment, the RF power supply unit 45 may be configured to supply the first RF signal from the RF generator to the lower electrode 421 and supply the second RF signal from another RF generator to the lower electrode 421. Further, a third RF signal may be supplied from still another RF generator to the upper electrode showerhead assembly 43. In another alternative embodiment, a DC voltage may be applied to the upper electrode showerhead assembly 43. In various embodiments, amplitudes of one or more RF signals (i.e., first RF signal, second RF signal, and the like) may be pulsated or modulated. The amplitude modulation may include the pulsating of the RF signal amplitude between ON and OFF states or between multiple different ON states. Further, the phase matching of the RF signals may be controlled, and the phase matching of the amplitude modulation of multiple RF signals may be synchronized or asynchronous.

The exhaust system 46 is connected to, for example, an exhaust port 41e disposed at the bottom portion of the chamber 41. The exhaust system 46 may include a vacuum pump such as a pressure valve, a turbo molecular pump, a roughing pump, or a combination thereof.

(Replacement Device 50)

Figure 3:
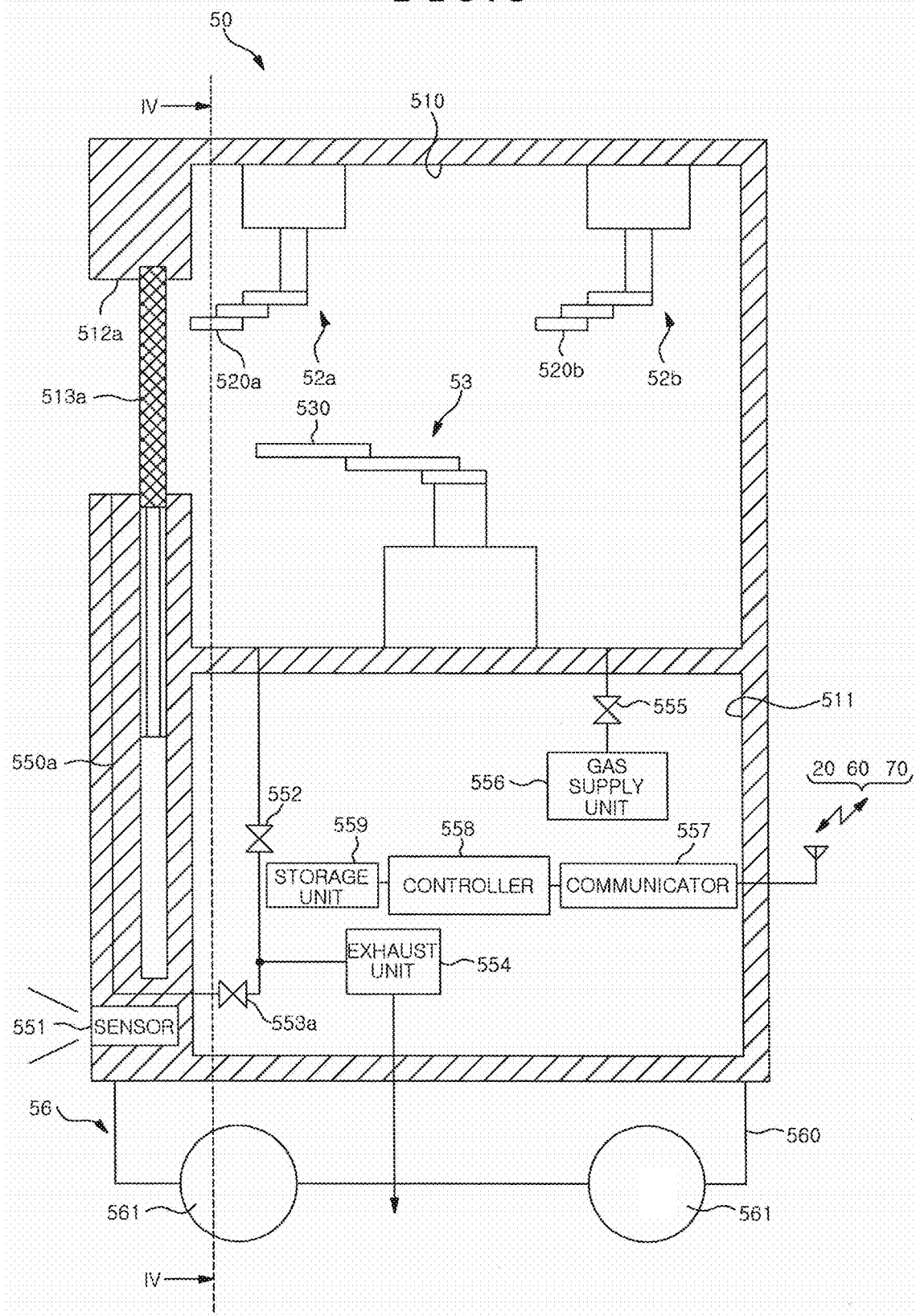
FIG. 3 is a schematic cross-sectional view showing an example of a replacement device.
Figure 4:
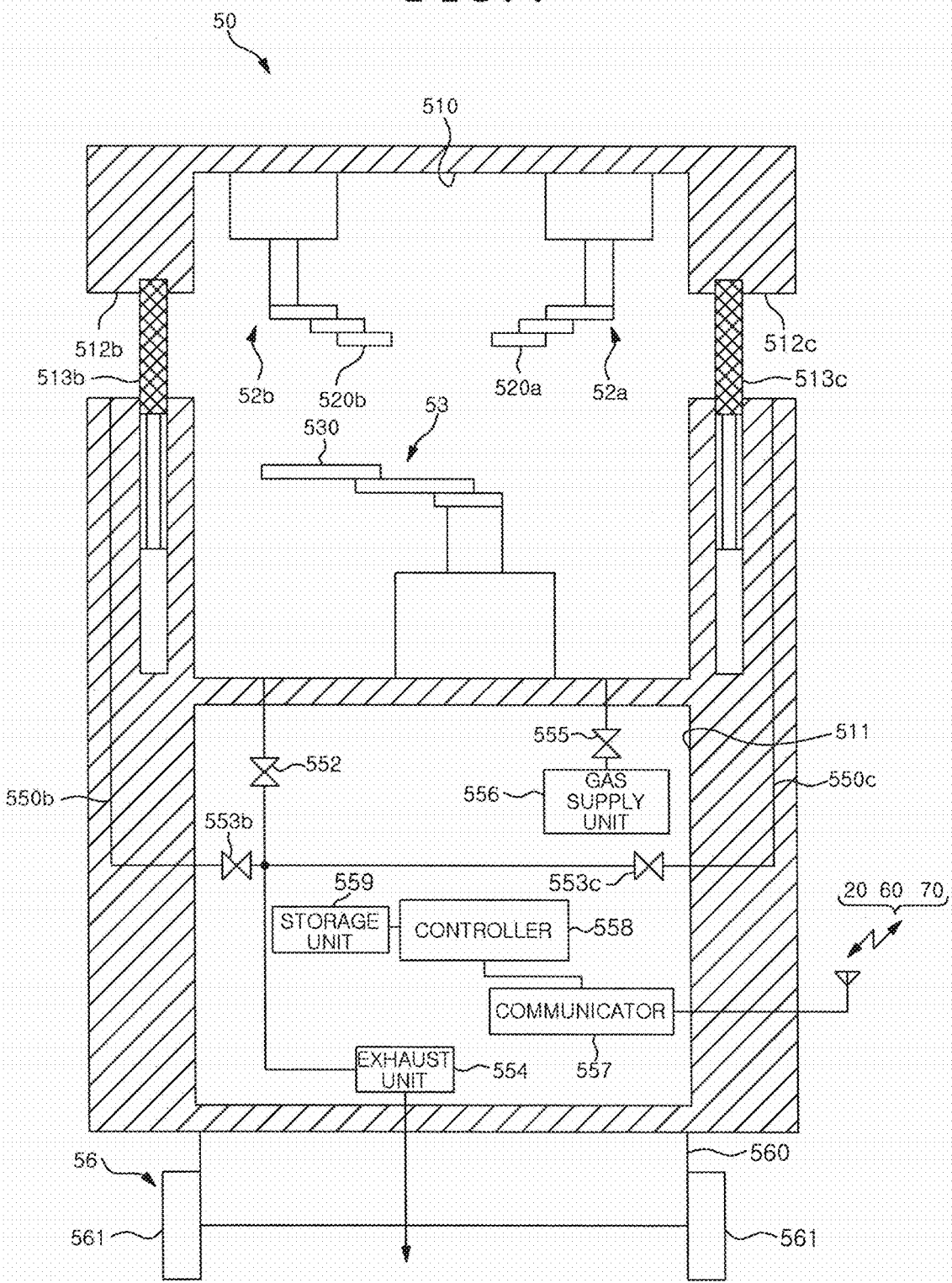
FIG. 4 shows an example of a cross-sectional view of the replacement device taken along a broken line IV-IV in FIG. 3.

FIG. 3 is a schematic cross-sectional view showing an example of the replacement device (part replacement device) 50. FIG. 4 shows an example of a cross-sectional view of the replacement device 50 taken along a broken line IV-IV shown in FIG. 3. The replacement device 50 includes an upper container 510, a lower container 511, and a mover 56. The upper container 510 is provided with an opening 512*a* to be connected to the processing device 40 and a gate valve 513*a* for opening and closing the opening 512*a*. Further, as shown in FIG. 4, the upper container 510 is provided with, for example, an opening 512*b* to be connected to the part storage device 60 and a gate valve 513*b* for opening and closing the opening 512*b*. Further, the upper container 510 is provided with an opening 512*c* to be connected to the jig storage device 70 and a gate valve 513*c* for opening and closing the opening 512*c*. The opening 512*a* is an example of a first part transfer port, and the gate valve 513*a* is an example of a first gate valve. The opening 512*b* is an example of a second part transfer port, and the gate valve 513*b* is an example of a second gate valve.

Operation robots 52*a* and 52*b* and a transfer robot 53 are disposed in the upper container 510. In the following description, the operation robots 52*a* and 52*b* will be collectively referred to as "operation robot 52" unless otherwise stated.

The operation robot 52*a* has an operation arm 520*a*, and the operation robot 52*b* has an operation arm 520*b*. An end effector is attached to each of the tip ends of the operation arms 520*a* and 520*b*. The operation robots 52*a* and 52*b* perform operations such as sensing in the processing device 40, removal (separation) of consumable parts, and installation of consumable parts using the end effectors attached to the tip ends of the operation arms 520*a* and 520*b*.

The transfer robot 53 has a transfer arm 530. The tip end of the transfer arm 530 is configured to hold a consumable part. The transfer robot 53 holds a consumable part separated by the operation robot 52 by using the tip end of the transfer arm 530. Then, the transfer robot 53 unloads the consumable part held thereon from the processing device 40 and stores the consumable part in the part storage device 60. Further, the transfer robot 53 unloads an unused consumable part from the part storage device 60 by using the tip end of the transfer arm 530 and loads the unused consumable part unloaded from the part storage device 60 into the processing device 40. The unused consumable part loaded into the processing device 40 is installed in the processing device 40 by using the end effectors attached to the tip ends of the operation arms 520*a* and 520*b*.

An exhaust unit 554, a gas supply unit 556, a communicator 557, a controller 558, and a storage unit 559 are disposed in the lower container 511. The communicator 557 is, for example, a wireless communication circuit, and performs wireless communication with the control device 20, the part storage device 60, and the jig storage device 70. A sensor 551 is disposed on an outer wall of the replacement device 50. The sensor 551 senses the surroundings of the replacement device 50 and outputs the sensing result to the controller 558. In the present embodiment, the sensor 551 is, for example, an image sensor, and outputs an image of the surroundings of the replacement device 50 to the controller 558. The sensor 551 is an example of a first sensor.

The exhaust unit 554 is connected to an inner space of the upper container 510 through a valve 552. The exhaust unit 554 performs suction of a gas in the upper container 510 through the valve 552, and discharges the gas to the outside of the replacement device 50. Accordingly, the pressure in the upper container 510 can be reduced to a predetermined vacuum level.

Further, the exhaust unit 554 is connected to the opening 512*a* through a valve 553*a* and a pipe 550*a*. After the replacement device 50 and the processing device 40 are connected to each other, the exhaust unit 554 exhausts air from the connection portion between the replacement device 50 and the processing device 40 through the pipe 550*a* and the valve 553*a*. Accordingly, a pressure in the connection portion between the part changing device 50 and the processing device 40 can be reduced to a predetermined vacuum level before the gate valve 513*a* is opened.

Figure 5:
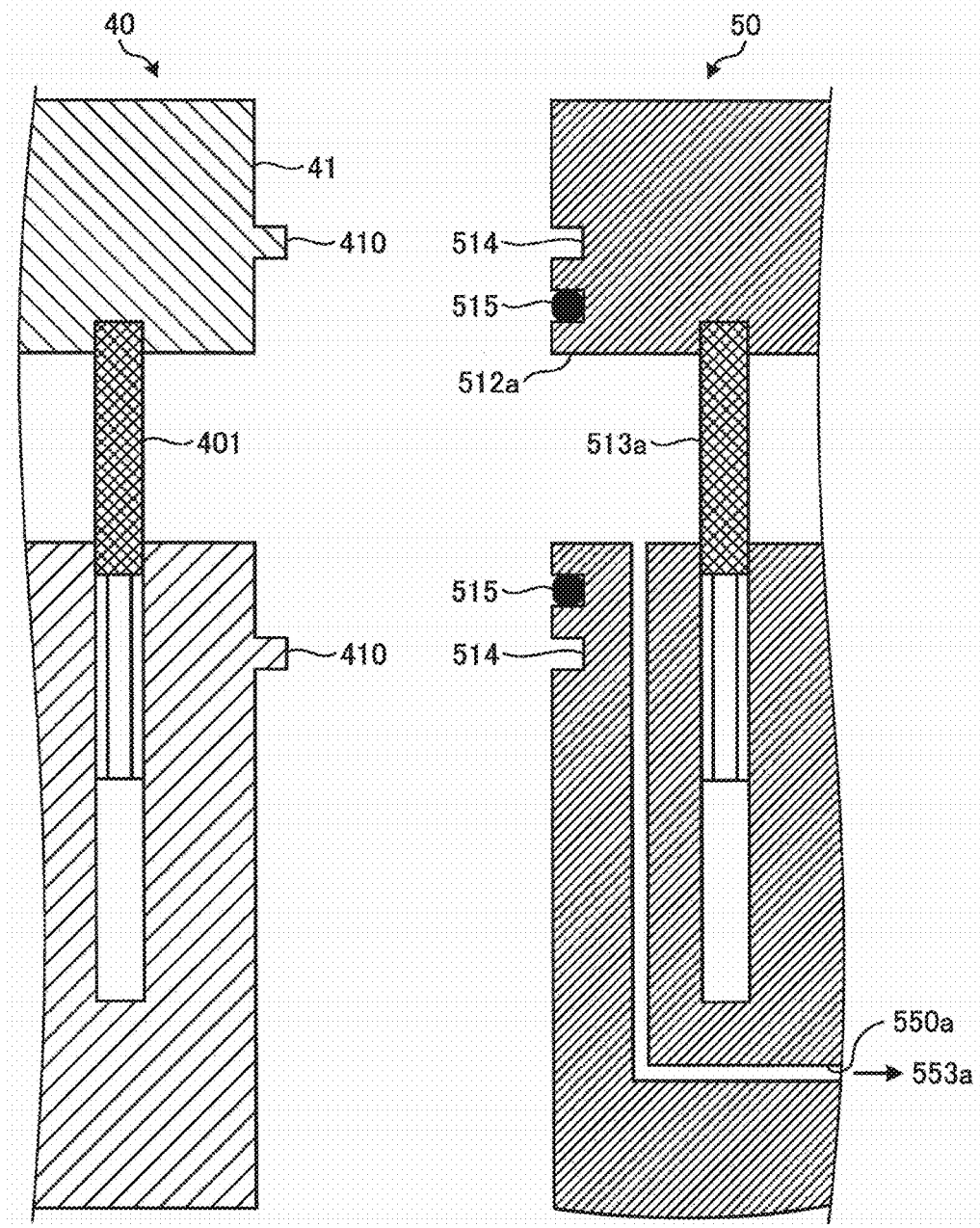
FIGS. 5 and 6 are enlarged cross-sectional views showing an example of a connection portion between the processing device and the replacement device.
Figure 6:
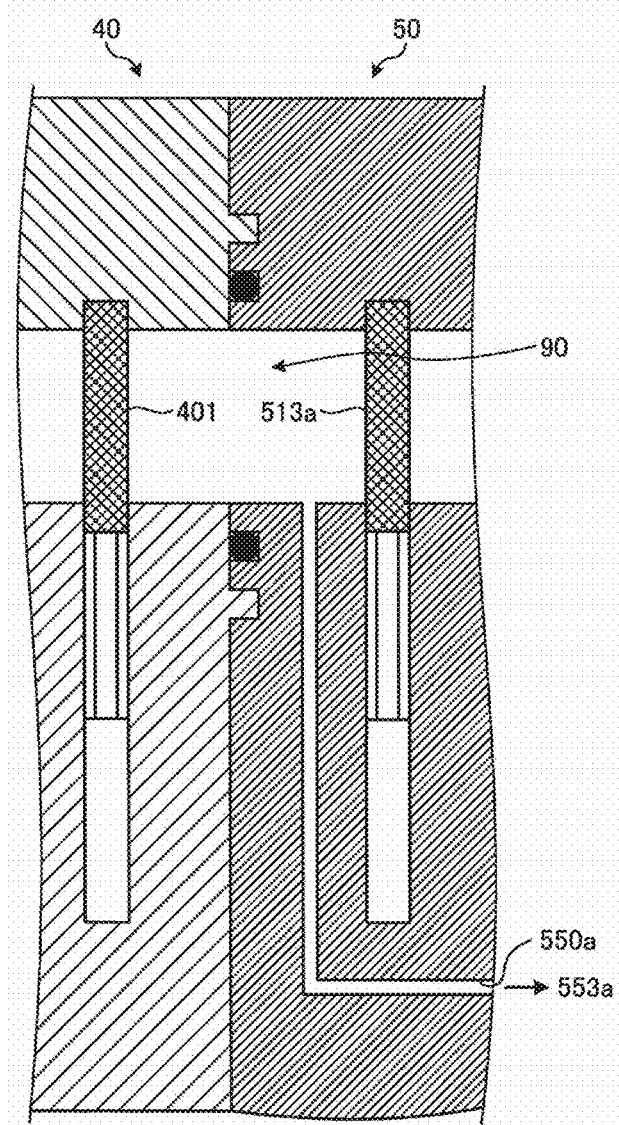

FIGS. 5 and 6 are enlarged cross-sectional views showing an example of the connection portion between the processing device 40 and the replacement device 50. Protrusions 410 are formed on a side surface of the chamber 41 of the processing device 40 to which the replacement device 50 is connected. Further, recesses 514, each having a shape corresponding to the corresponding protrusion 410, are formed on a side surface of the replacement device 50 to be connected to the processing device 40. As shown in FIG. 6, when the processing device 40 and the replacement device 50 are connected, the protrusions 410 and the recesses 514 are fitted to each other to support positional alignment of the processing device 40 and the replacement device 50.

Further, a seal member 515 such as an O-ring is disposed on the side surface of the replacement device 50 to surround the opening 512*a*. Accordingly, airtightness of a space 90 surrounded by the chamber 41, the gate valve 401, the opening 512*a*, and the gate valve 513*a* can be improved. Since a gas in the space 90 is exhausted through the pipe 550*a* after the processing device 40 and the replacement device 50 are connected, the pressure in the space 90 can be reduced to a predetermined vacuum level. By reducing the pressure in the space 90, the connection between the processing device 40 and the replacement device 50 becomes stronger. Further, when the connection between the processing device 40 and the replacement device 50 is released, the pressure in the space 90 is returned to the atmospheric pressure by opening a valve (not shown) connected to the pipe 550*a*.

Referring back to FIG. 4, the exhaust unit 554 is connected to the opening 512*b* through a valve 553*b* and a pipe 550*b*. After the replacement device 50 and the part storage device 60 are connected to each other, the exhaust unit 554 exhausts air from the connection portion between the replacement device 50 and the part storage device 60 through the pipe 550*b* and the valve 553*b*. Accordingly, the pressure in the connection portion between the replacement device 50 and the part storage device 60 can be reduced to a predetermined vacuum level before the gate valve 513*b* is opened. The connection portion between the replacement device 50 and the part storage device 60 is provided with the recesses and the protrusions illustrated in FIGS. 5 and 6, so that the positional alignment of the replacement device 50 and the part storage device 60 is supported by the recesses and the protrusions.

Further, the exhaust unit 554 is connected to the opening 512*c* through a valve 553*c* and a pipe 550*c* as shown in FIG. 4, for example. The exhaust unit 554 exhausts air from the connection portion between the replacement device 50 and the jig storage device 70 through the pipe 550*c* and the valve 553*c* after the replacement device 50 and the jig storage device 70 are connected to each other. Accordingly, the pressure in the connection portion between the replacement device 50 and the jig storage device 70 can be reduced to a predetermined vacuum level before the gate valve 513*c* is opened. The connection portion between the replacement device 50 and the jig storage device 70 is provided with the recesses and the protrusions illustrated in FIGS. 5 and 6, so that the positional alignment between the replacement device 50 and the jig storage device 70 is supported by the recesses and the protrusions.

The gas supply unit 556 is connected to the upper container 510 through a valve 555. The gas supply unit 556 supplies an inert gas such as nitrogen gas into the upper container 510 through the valve 555. The controller 558 controls the valve 555 to supply a gas into the upper container 510 to maintain the pressure in the upper container 510 at a pressure higher than the pressure in the processing device 40. Accordingly, it is possible to prevent particles in the processing device 40 from entering the upper container 510. The valve 555 is an example of a pressure adjuster.

The inert gas may be supplied to the connection portion between the replacement device 50 and the processing device 40. Therefore, gas flow from the connection portion between the replacement device 50 and the processing device 40 into the processing device 40 and gas flow from the connection portion between the replacement device 50 and the processing device 40 into the replacement device 50 are generated. Accordingly, it is possible to suppress the intrusion of the particles in the processing device 40 into the upper container 510, and also possible to suppress the intrusion of the particles in the upper container 510 into the processing device 40. The opening/closing of the valves 552, 553a to 553c, and 555 is controlled by the controller 558.

The storage unit 559 is a read only memory (ROM), a hard disk drive (HDD), a solid state drive (SSD), or the like, and stores data and a program used by the controller 558. The controller 558 is a processor such as a central processing unit (CPU), a digital signal processor (DSP) or the like, and controls individual components of the replacement device 50 by reading out and executing the program in the storage unit 559.

The controller 558 controls the mover 56 based on the sensing result of the sensor 551 to move the replacement device 50 to the position of the processing device 40 specified by the control device 20. The controller 558 is an example of a first controller, and the mover 56 is an example of a first mover.

The mover 56 includes a main body 560 and wheels 561. A power supply such as a battery, a power source, and a steering mechanism are provided in the main body 560. The wheels 561 are rotated by the power source in the main body 560 to move the replacement device 50 in a direction controlled by the steering mechanism in the main body 560. Further, the mover 56 may move the replacement device 50 by using a method such as a walking-type method other than the method of using the wheels 561 as long as the replacement device 50 can be moved.

(Part Storage Device 60)

Figure 7:
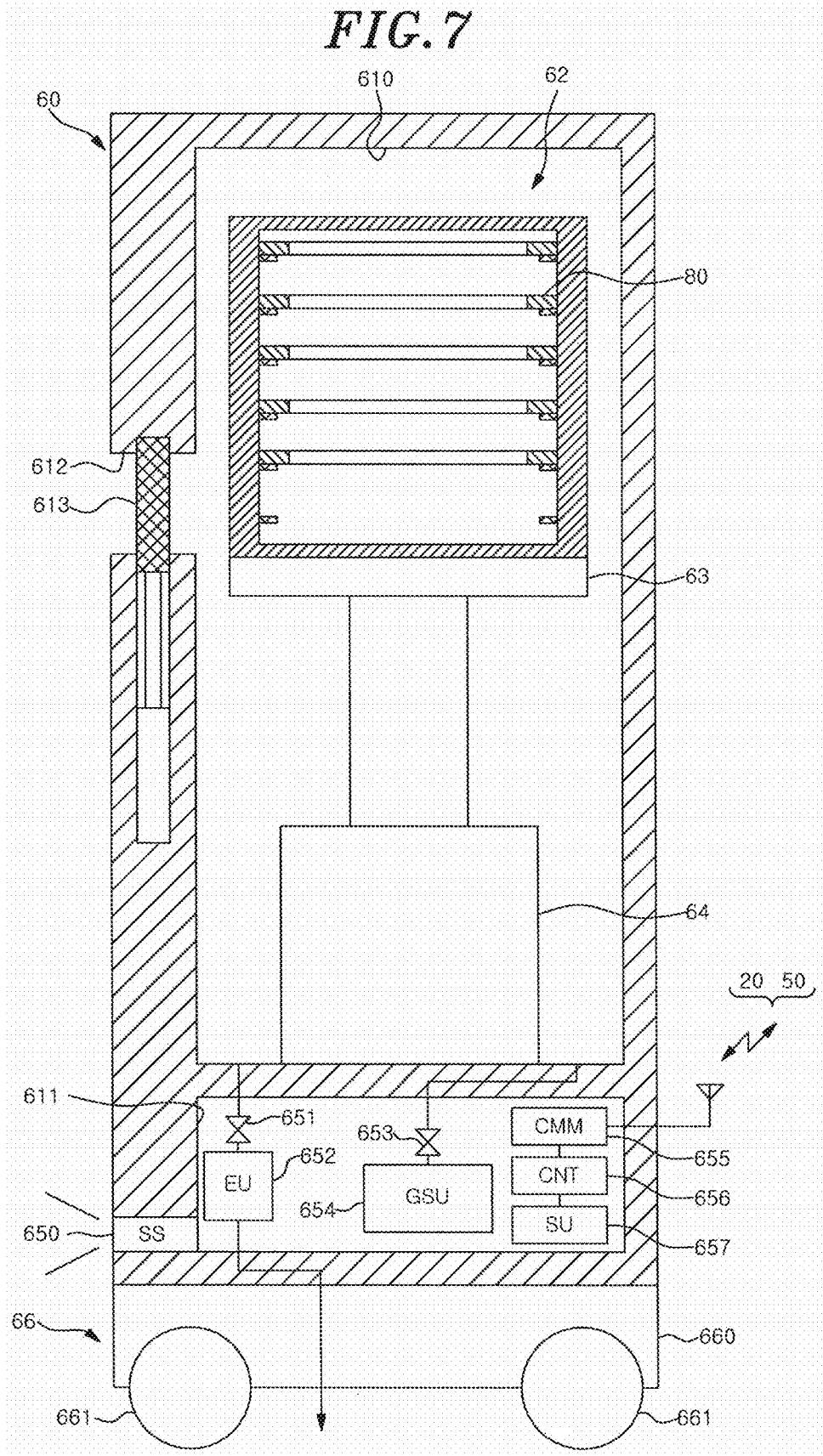
FIG. 7 is a schematic cross-sectional view showing an example of a part storage device.

FIG. 7 is a schematic cross-sectional view showing an example of the part storage device 60. The part storage device 60 includes an upper container 610, a lower container 611, and a mover (moving mechanism) 66. The upper container 610 is provided with an opening 612 to be connected to the replacement device 50 and a gate valve 613 for opening and closing the opening 612. A stage 63 and a driving unit 64 are disposed in the upper container 610. A cassette 62 in which a plurality of unused consumable parts 80 are stacked in a vertical direction is disposed on the stage 63. The cassette 62 has therein a space accommodating at least one used consumable part 80. In the present embodiment, multiple types of consumable parts 80 are accommodated in the cassette 62. The consumable part 80 is, for example, the edge ring 423, the upper electrode 43e, or the like.

The stage 63 is vertically moved by the driving unit 64. Accordingly, the transfer robot 53 in the replacement device 50 connected to the part storage device 60 can extract an unused consumable part 80 from the cassette 62 through the opening 612, and can store a used consumable part 80 in the cassette 62. When all the consumable parts 80 in the cassette 62 are used consumable parts, the cassette 62 is replaced with another cassette 62 storing unused consumable parts 80.

An exhaust unit (EU) 652, a gas supply unit (GSU) 654, a communicator (CMM) 655, a controller (CNT) 656, and a storage unit (SU) 657 are disposed in the lower container 611. The communicator 655 is, for example, a wireless communication circuit, and performs wireless communication with the control device 20 and the replacement device 50. A sensor (SS) 650 is disposed on an outer wall of the part storage device 60. The sensor 650 senses the surroundings of the part storage device 60 and outputs the sensing result to the controller 656. In the present embodiment, the sensor 650 is, for example, an image sensor, and outputs an image the surroundings of the part storage device 60 to the controller 656. The sensor 650 is an example of a second sensor.

The exhaust unit 652 is connected to the inner space of the upper container 610 through a valve 651. The exhaust unit 652 performs suction of a gas in the upper container 610 through the valve 651, and discharges the gas to the outside of the part storage device 60. Accordingly, the pressure in the upper container 610 can be reduced to a predetermined vacuum level.

The gas supply unit 654 is connected to the upper container 610 through a valve 653. The gas supply unit 654 supplies an inert gas such as nitrogen gas into the upper container 610 through the valve 653. By supplying a gas into the upper container 610, the pressure in the upper container 610 can be maintained to be higher than the pressure in the upper container 510 of the replacement device 50. Accordingly, it is possible to suppress the intrusion of the particles in the upper container 510 of the replacement device 50 into the upper container 610.

Further, the inert gas may be supplied to the connection portion between the part storage device 60 and the replacement device 50. Therefore, gas flow from the connection portion between the part storage device 60 and the replacement device 50 into the upper container 610 and gas flow from the connection portion between the part storage device 60 and the replacement device 50 into the upper container 510 are generated. Accordingly, it is possible to suppress the intrusion of the particles in the replacement device 50 into the upper container 610, and also possible to suppress the intrusion of the particles in the upper container 610 into the upper container 510. The opening/closing of the valves 651 and 653 is controlled by the controller 656.

The storage unit 657 is a ROM, an HDD, an SSD, or the like, and stores data and a program used by the controller 656. The controller 656 is, for example, a processor such as a CPU, a DSP, or the like, and controls individual components of the part storage device 60 by reading out and executing the program in the storage unit 657.

The controller 656 controls the mover 66 based on the sensing result of the sensor 650 to move the part storage device 60 to the position of the replacement device 50 connected to the processing device 40 specified by the control device 20. The controller 656 is an example of a second controller, and the mover 66 is an example of a second mover.

The mover 66 includes a main body 660 and wheels 661. A power supply such as a battery, a power source, and a steering mechanism are provided in the main body 660. The wheels 661 are rotated by the power source in the main body 660 to move the part storage device 60 in a direction controlled by the steering mechanism in the main body 660. Further, the mover 66 may move the part storage device 60 by using a method such as a walking-type method other than the method of using the wheels 661 as long as the part storage device 60 can be moved.

(Jig Storage Device 70)

Figure 8:
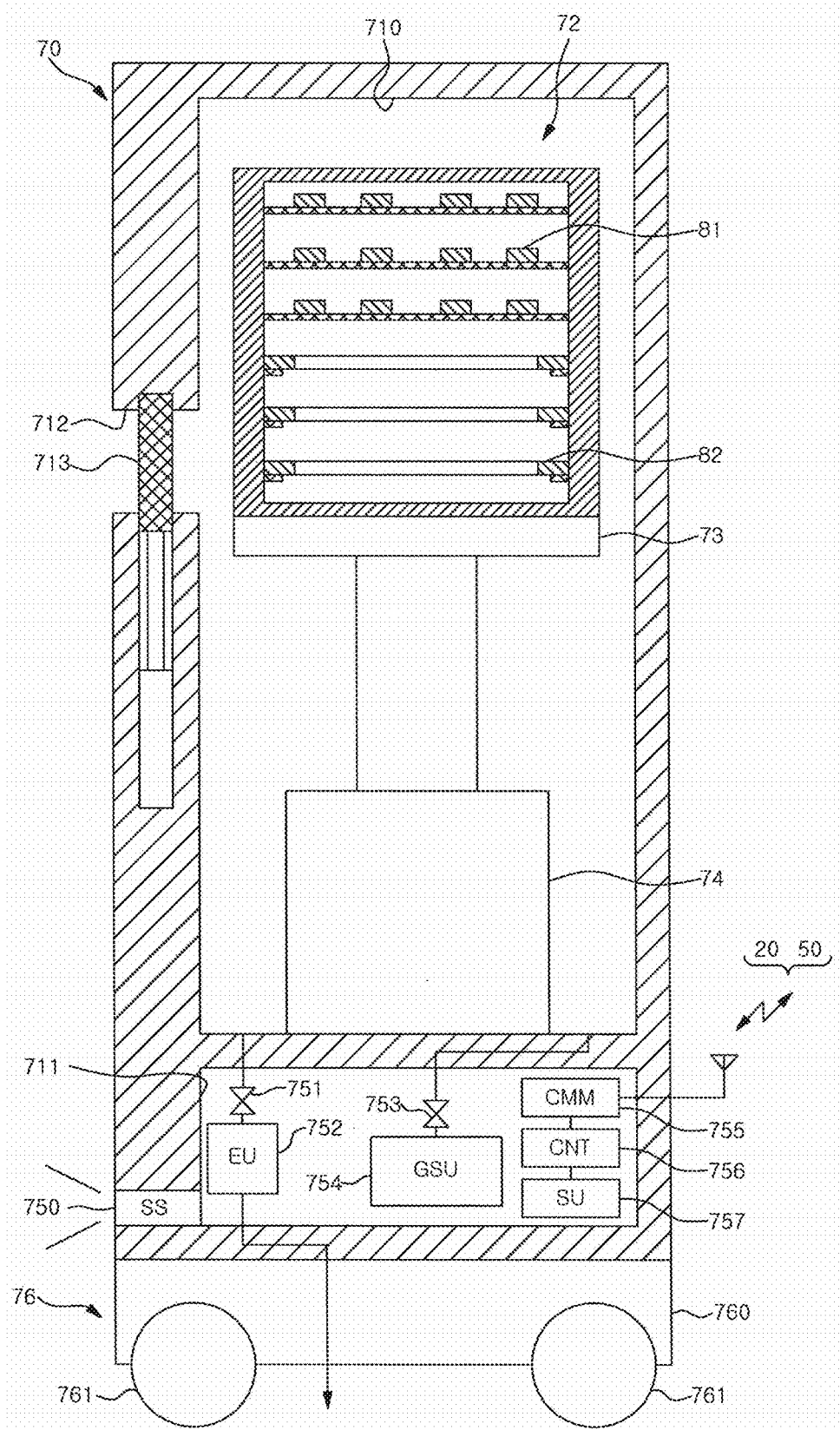
FIG. 8 is a schematic cross-sectional view showing an example of a jig storage device.

FIG. 8 is a schematic cross-sectional view showing an example of the jig storage device 70. The jig storage device 70 has an upper container 710, a lower container 711, and a mover (moving mechanism) 76. The upper container 710 is provided with an opening 712 to be connected to the replacement device 50 and a gate valve 713 for opening and closing the opening 712. A stage 73 and a driving unit 74 are disposed in the upper container 710. A cassette 72 in which a plurality of end effectors 81 and a plurality of holding members 82 are accommodated in a vertical direction is disposed on the stage 73.

The stage 73 is vertically moved by the driving unit 74. Accordingly, the operation robot 52 in the replacement device 50 connected to the jig storage device 70 can attach the end effector 81 in the cassette 72 to the tip end of the operation arm 520a through the opening 712. Further, the transfer robot 53 can attach the holding member 82 in the cassette 72 to the tip end of the transfer arm 530 through the opening 712.

An exhaust unit (EU) 752, a gas supply unit (GSU) 754, a communicator (CMM) 755, a controller (CNT) 756, and a storage unit (SU) 757 are disposed in the lower container 711. The communicator 755 is, for example, a wireless communication circuit, and performs wireless communication with the control device 20 and the replacement device 50. A sensor (SS) 750 is disposed on an outer wall of the jig storage device 70. The sensor 750 senses the surroundings of the jig storage device 70 and outputs the sensing result to the controller 756. In the present embodiment, the sensor 750 is, for example, an image sensor, and outputs an image the surroundings of the jig storage device 70 to the controller 756.

The exhaust unit 752 is connected to the inner space of the upper container 710 through a valve 751. The exhaust unit 752 performs suction of a gas in the upper container 710 through the valve 751 and discharges the gas to the outside of the jig storage device 70. Accordingly, the pressure in the upper container 710 can be reduced to a predetermined vacuum level.

The gas supply unit 754 is connected to the upper container 710 through a valve 753. The gas supply unit 754 supplies an inert gas such as nitrogen gas into the upper container 710 through the valve 753. By supplying a gas into the upper container 710, the pressure in the upper container 710 can be maintained to be higher than the pressure in the upper container 510 of the replacement device 50. Accordingly, it is possible to suppress the intrusion of the particles in the upper container 510 into the upper container 710.

Further, the inert gas may be supplied to the connection portion between the jig storage device 70 and the replacement device 50. Therefore, gas flow from the connection portion between the jig storage device 70 and the replacement device 50 into the upper container 710 and gas flow from the connection portion between the jig storage device 70 and the replacement device 50 into the upper container 510 are generated. Accordingly, it is possible to suppress the intrusion of the particles in the replacement device 50 into the upper container 710, and also possible to suppress the intrusion of the particles in the upper container 710 into the upper container 510. The opening/closing of the valves 751 and 753 is controlled by the controller 756.

The storage unit 757 is a ROM, an HDD, an SSD, or the like, and stores data and a program used by the controller 756. The controller 756 is, for example, a processor such as a CPU, a DSP, or the like, and controls individual components of the jig storage device 70 by reading out and executing the program in the storage unit 757.

The controller 756 controls the mover 76 based on the sensing result of the sensor 750 to move the jig storage device 70 to the position of the replacement device 50 connected to the processing device 40 specified by the control device 20.

The mover 76 includes a main body 760 and wheels 761. A power supply such as a battery, a power source, and a steering mechanism are provided in the main body 760. The wheels 761 are rotated by the power source in the main body 760 to move the jig storage device 70 in a direction controlled by the steering mechanism in the main body 760. Further, the mover 76 may move the jig storage device 70 by using a method such as a walking-type method other than the method of using the wheels 761 as long as the jig storage device 70 can be moved.

(Sequence of Replacing the Consumable Part 80)

Next, a sequence of replacing the consumable part 80 will be described with reference to FIGS. 9 to 18.

First, in response to the instruction from the control device 20, the replacement device 50, the part storage device 60, and the jig storage device 70 move to the position of the processing device 40 having the consumable part 80 that needs to be replaced. Then, the replacement device 50 is connected to the processing device 40 having the consumable part 80 that requires replacement, and the part storage device 60 and the jig storage device 70 are connected to the replacement device 50. Then, the pressures in the processing device 40, the replacement device 50, the part storage device 60, and the jig storage device 70 are adjusted, and the gate valves are opened.

Figure 9:
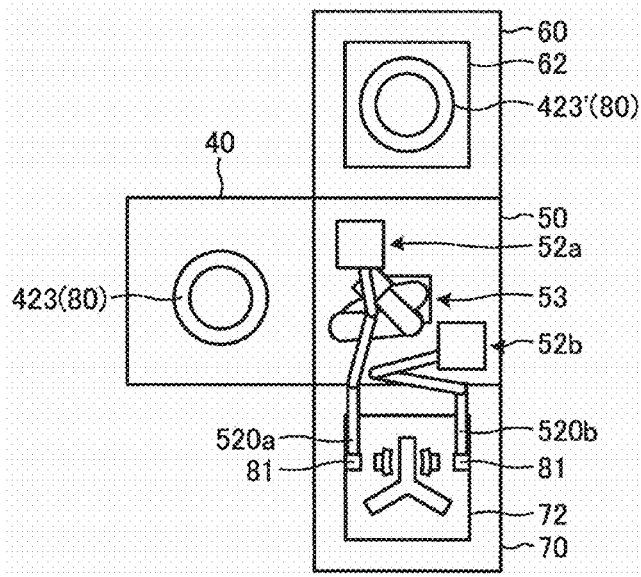
FIGS. 9 to 18 show a sequence of replacing a consumable part.

Then, as shown in FIG. 9, for example, the end effector 81 for sensing is attached to each of the tip end of the operation arm 520a of the operation robot 52a and the tip end of the operation arm 520b of the operation robot 52b. The end effector 81 for sensing is, for example, an image sensor or a distance sensor. The used consumable part 80 (edge ring 423 in the example of FIG. 9) is installed in the processing device 40, and the unused consumable part 80 (edge ring 423' in the example of FIG. 9) is accommodated in the cassette 62 of the part storage device 60.

Figure 10:
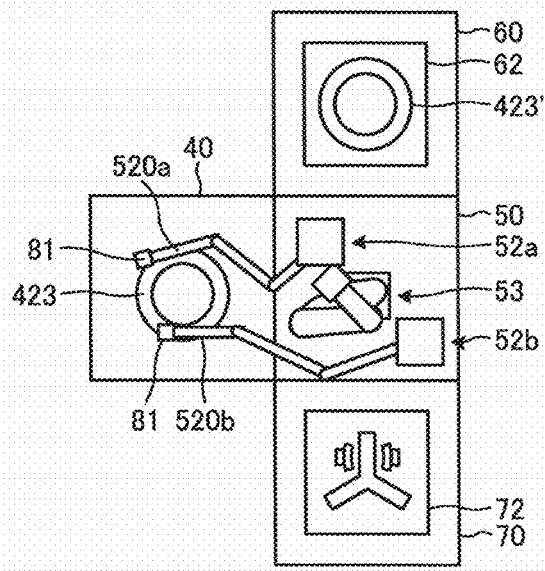

Next, the operation robots 52a and 52b sense the used edge ring 423 in the processing device 40 using the end effectors 81 such as the image sensors as shown in FIG. 10, for example. The sensing result is output to the controller 558 in the replacement device 50. The controller 558 determines whether or not the replacement of the edge ring 423 using the operation robots 52a and 52b can be performed based on the sensing result. If it is determined that the replacement of the edge ring 423 using the operation robots 52a and 52b cannot be performed, the controller 558 notifies an operator of the manufacturing system 10 of such decision. For example, when a large amount of reaction by-products (so-called deposits) are adhered to the edge ring 423, or when the edge ring 423 is deformed, the controller 558 determines that the replacement of the edge ring 423 using the operation robots 52a and 52b cannot be performed. The controller 558 is an example of a determination unit.

Figure 11:
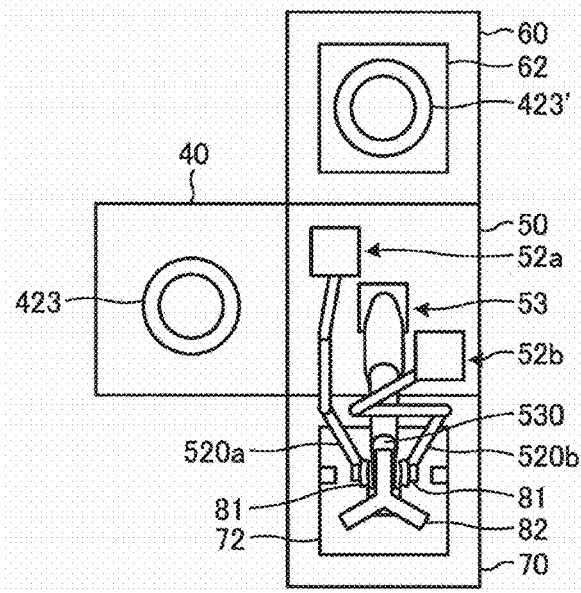

If it is determined that the replacement of the edge ring 423 can be performed, the end effectors 81 for removing the edge ring 423 are attached to the tip ends of the operation arms 520a and 520b as shown in FIG. 11, for example. Further, the holding member 82 for holding the edge ring 423 is attached to the tip end of the transfer arm 530 of the transfer robot 53.

Figure 12:
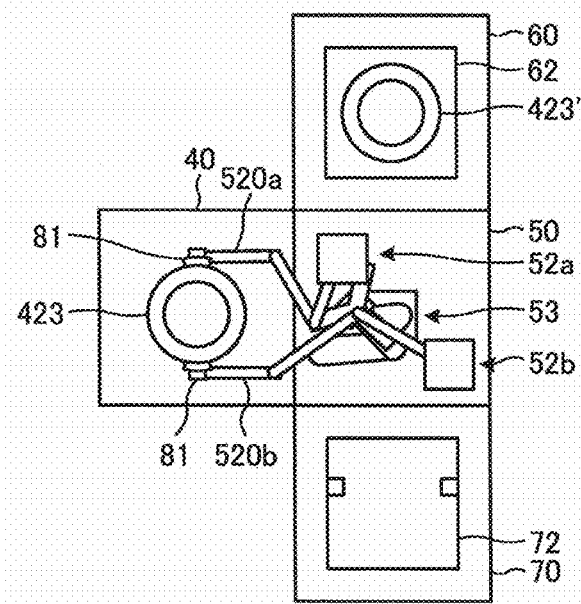
Figure 13:
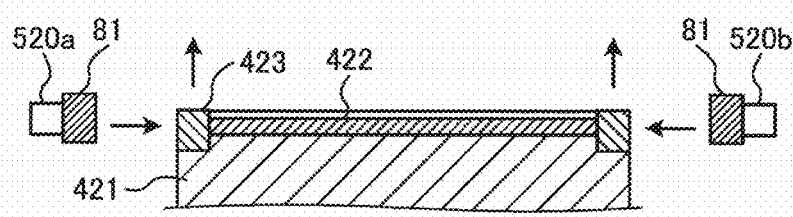

Next, as shown in FIG. 12, for example, the tip ends of the operation arms 520a and 520b enter the processing device 40, and the edge ring 423 in the processing device 40 is separated by the operation arms 520a and 520b. When the edge ring 423 is separated, the edge ring 423 is sandwiched between the end effector 81 at the tip end of the operation arm 520a and the end effector 81 at the tip end of the operation arm 520b, as shown in FIG. 13, for example. Then, the edge ring 423 is lifted and separated from the lower electrode 421 by raising the operation arms 520a and 520b.

Figure 14:
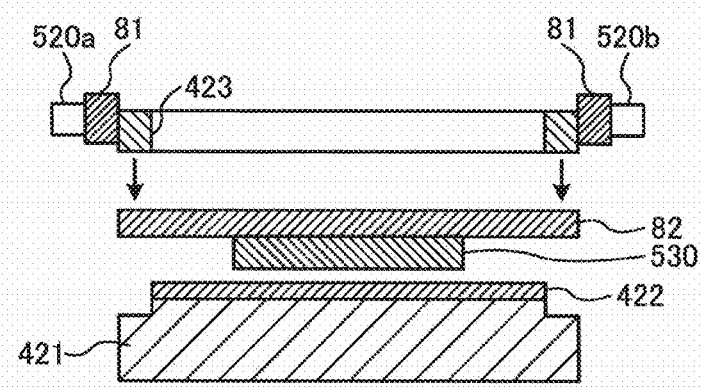
Figure 15:
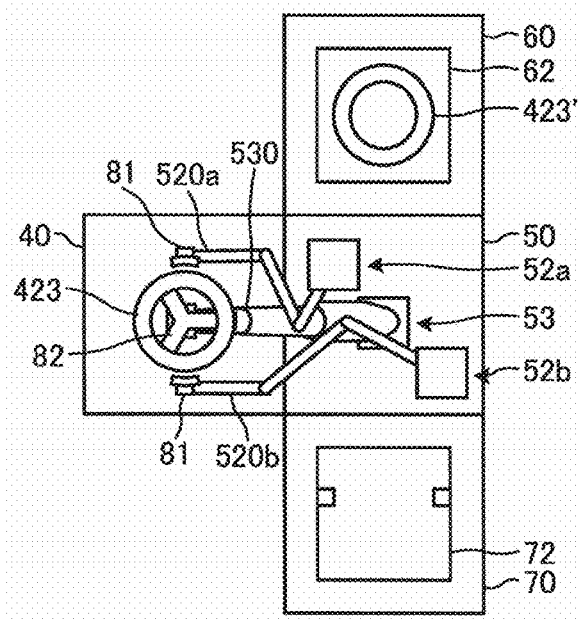

Then, as shown in FIG. 14, for example, the holding member 82 attached to the tip end of the transfer arm 530 is inserted between the lifted edge ring 423 and the lower electrode 421. Then, as the operation arms 520a and 520b are lowered, the edge ring 423 is placed on the holding member 82. Then, as shown in FIG. 15, for example, the end effectors 81 at the tip ends of the operation arms 520a and 520b are separated from the edge ring 423.

Figure 16:
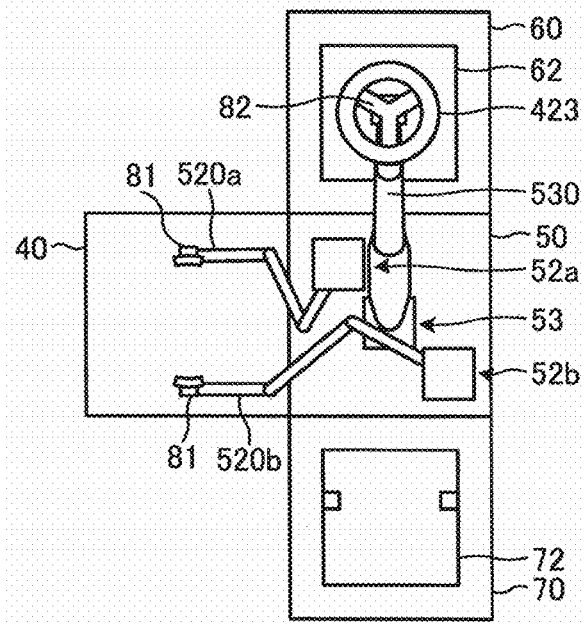
Figure 17:
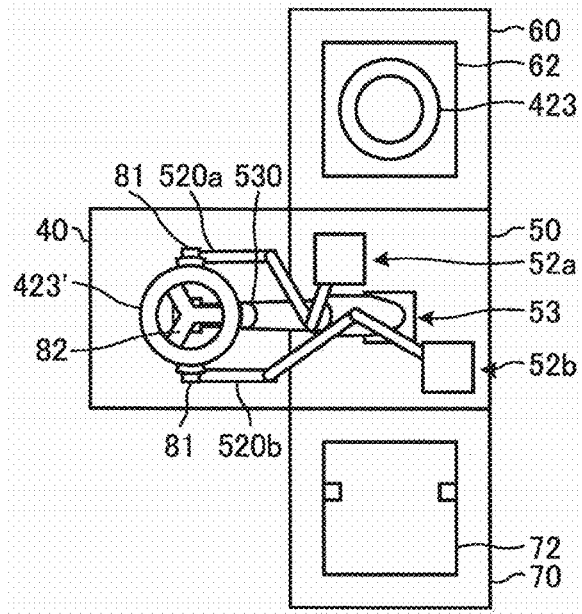

Next, the transfer robot 53 accommodates the used edge ring 423 on the holding member 82 into the cassette 62 of the part storage device 60 as shown in FIG. 16, for example. Then, the transfer robot 53 extracts the unused edge ring 423' from the cassette 62 and loads the unused edge ring 423' into the processing device 40 as shown in FIG. 17, for example. The end effectors 81 at the tip ends of the operation arms 520a and 520b and the holding member 82 at the tip end of the transfer arm 530 may be cleaned before the unused edge ring 423' is extracted from the cassette 62. Accordingly, it is possible to prevent the deposits or the like that are peeled off from the used edge ring 423 from being adhered as particles to the unused edge ring 423' through the end effectors 81 or the holding member 82. The cleaning may be, e.g., gas purging performed by injecting an inert gas.

Then, the edge ring 423' is sandwiched between the end effector 81 at the tip end of the operation arm 520a and the end effector 81 at the tip end of the operation arm 520b. Then, the edge ring 423' is lifted from the holding member 82 at the tip end of the transfer arm 530 by raising the operation arms 520a and 520b. Then, the holding member 82 is retracted from a position in the space between the lifted edge ring 423' and the lower electrode 421, and the operation arms 520a and 520b are lowered so that the edge ring 423' can be placed on the lower electrode 421.

Figure 18:
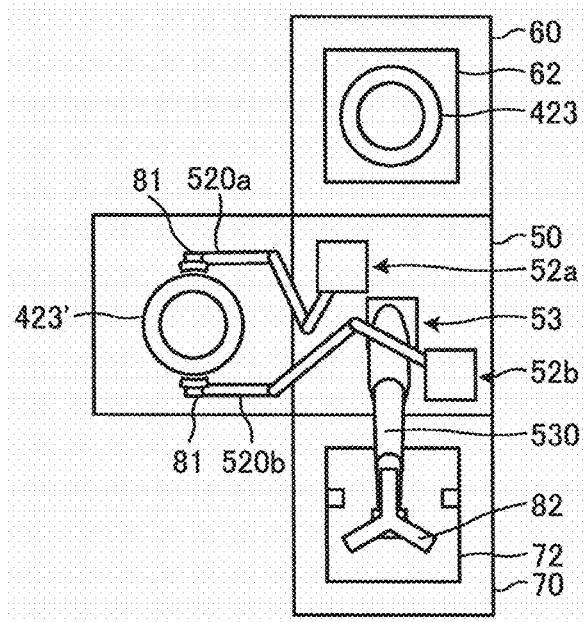

Then, as shown in FIG. 18, for example, the end effectors 81 at the tip ends of the operation arms 520a and 520b are separated from the edge ring 423'. Then, the end effectors 81 and the holding member 82 are returned to the cassette 72. Then, the gate valves of the processing device 40, the replacement device 50, the part storage device 60, and the jig storage device 70 are closed. Then, the connection between the processing device 40 and the replacement device 50, the connection between the replacement device 50 and the part storage device 60, and the connection between the replacement device 50 and the jig storage device 70 are released.

In the case of replacing the upper electrode 43e as the consumable part 80, first, the holding member 82 attached to the tip end of the transfer arm 530 is inserted to a position below the upper electrode 43e. Then, the transfer arm 530 is raised so that the holding member 82 is brought into contact with a bottom surface of the upper electrode 43e. Then, the fixing member 43f such as a screw is removed by the end effectors 81 attached to the tip ends of the operation arms 520a and 520b. Accordingly, the upper electrode 43e held by the holding member 82 is unloaded from the processing device 40 and accommodated in the part storage device 60 by the transfer arm 530.

Then, the unused upper electrode 43e is unloaded from the part storage device 60, loaded into the processing device 40, and transferred to the position of a bottom surface of the electrode holder 43d. Then, the fixing member 43f is fixed by the end effectors 81 attached to the tip ends of the operation arms 520a and 520b, so that the upper electrode 43e is fixed to the electrode holder 43d. In this manner, the replacement of the upper electrode 43e is performed.

(Configuration of Control Device 20)

Figures 19, 20:
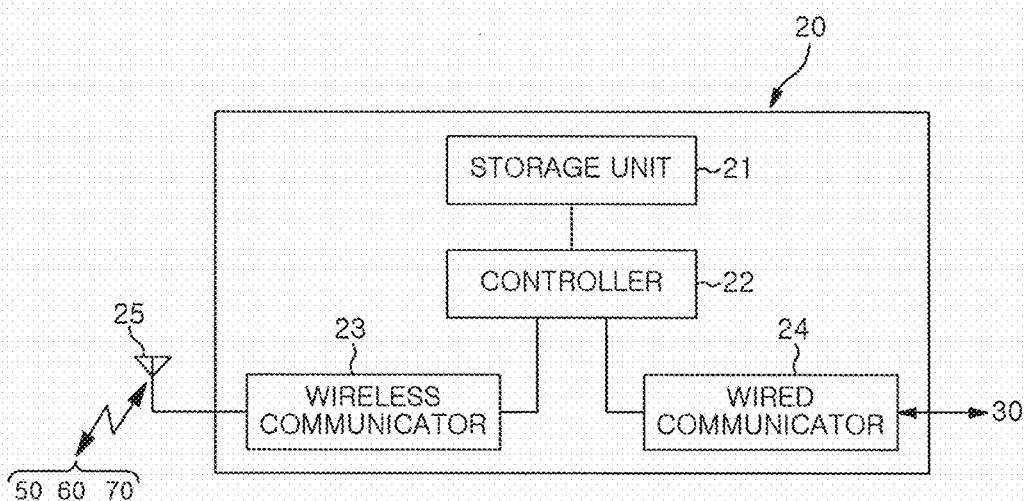
FIG. 19 is a block diagram showing an example of a control device.
FIG. 20 shows an example of a management table.

FIG. 19 is a block diagram showing an example of the control device 20. The control device 20 includes a storage unit 21, a controller 22, a wireless communicator 23, and a wired communicator 24. The wireless communicator 23 is, for example, a wireless communication circuit that performs wireless communication with each of the replacement device 50, the part storage device 60, and the jig storage device 70 through an antenna 25. The wired communicator 24 is, for example, a Network Interface Card (NIC) that communicates with each of the processing groups 30. Further, the control device 20 may perform wireless communication with each of the processing groups 30.

The storage unit 21 is a read-only memory (ROM), a hard disk drive (HDD), a solid-state drive (SSD), or the like, and stores data, a program, or the like used by the controller 22. For example, a management table 210 to be illustrated in FIG. 20 is stored in the storage unit 21.

FIG. 20 shows an example of the management table 210. In the management table 210, an individual table 212 is stored for each processing device ID 211 that identifies each processing device 40. The individual table 212 stores a part ID, a replacement date and time, an RF integration time, and a next replacement date and time. The part ID is information that identifies each consumable part 80. The replacement date and time is the date and time when the consumable part 80 was replaced. The RF integration time is information indicating an integration time of the processing performed in the processing device 40 using the RF signal. The next replacement date and time is the date and time at which the consumable part 80 is to be replaced next.

For example, the controller 22 is a processor such as a central processing unit (CPU) or a digital signal processor (DSP), and controls the entire control device 20 by reading out and executing a program in the storage unit 21.

(Processing of the Control Device 20)

Figure 21:
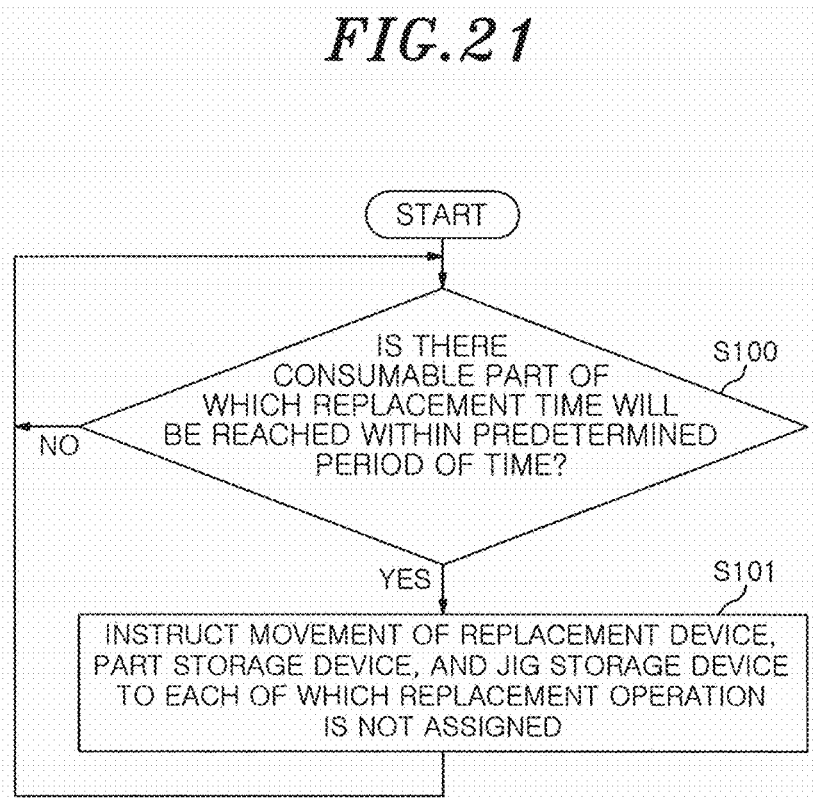
FIGS. 21 and 22 are flowcharts showing an example of processing of the controller.
Figure 22:
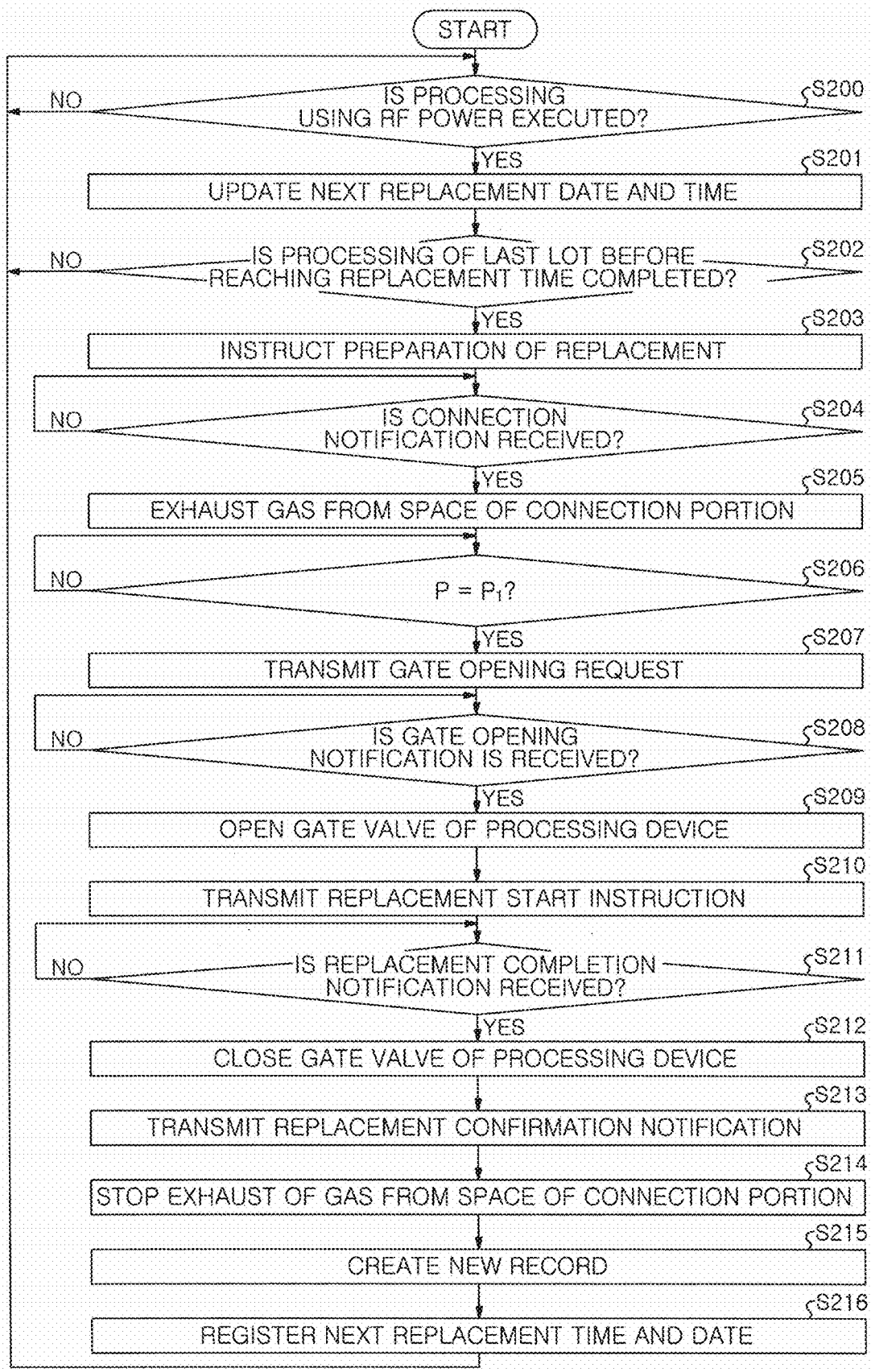

FIGS. 21 and 22 are flowcharts showing an example of processing of the control device 20. FIG. 21 shows an example of the processing of the control device 20 in the case of selecting the replacement device 50, the part storage device 60, and the jig storage device 70 that need to be moved to a position of the processing device 40 having the consumable part 80 that requires replacement. FIG. 22 shows an example of the processing of the control device 20 after the replacement device 50, the part storage device 60, and the jig storage device 70 are moved to the position of the processing device 40 having the consumable part 80 that requires replacement. The processing shown in FIGS. 21 and 22 is realized by executing the program read out from the storage unit 21 under the control of the controller 22 of the control device 20. FIG. 22 shows an example of the processing between the control device 20, one processing device 40, and one replacement device 50.

In the processing shown in FIG. 21, first, the controller 22 determines whether or not there is a consumable part 80 of which a replacement time will be reached within a predetermined period of time from a current time (step S100). For example, the controller 22 refers to the "next replacement date and time" column of the management table 210 to determine whether or not there is a consumable part 80 of which a replacement time will be reached within a predetermined period of time from the current time. If there is no consumable part 80 of which a replacement time will be reached within the predetermined period of time from the current time (NO in step S100), the controller 22 executes the processing shown in step S100 again.

On the other hand, if there is a consumable part 80 of which a replacement time will be reached within the predetermined period of time from the current time (YES in step S100), the controller 22 specifies the replacement device 50, the part storage device 60, and the jig storage device 70 to each of which the replacement operation is not assigned. Then, the controller 22 controls the specified replacement device 50, the specified part storage device 60, and the specified jig storage device 70 to move to the position of the processing device 40 having the consumable part 80 of which the replacement time will be reached within a predetermined period of time (step S101). Then, the controller 22 executes the processing shown in step S100 again.

In the processing shown in FIG. 22, first, the controller 22 determines whether or not the processing using the RF power is executed in the processing device 40 (step S200). If the processing using the RF power is not executed (NO in step S200), the controller 22 executes the processing shown in step S200 again.

On the other hand, if the processing using the RF power is executed (YES in step S200), the controller 22 updates every "RF integration time" in the individual table 212 associated with the processing device ID 211 of the processing device 40 that has performed the processing using the RF power in the management table 210. Then, the controller 22 estimates a "next replacement date and time" for each consumable part 80 of which an "RF integration time" is updated in the individual table 212 and updates the "next replacement date and time" of each consumable part 80 in the individual table 212 to the estimated "next replacement date and time" (step S201). Accordingly, the "next replacement date and time" corresponding to each consumable part 80 is updated based on an actual processing time using the RF power.

Next, the controller 22 determines whether or not processing of the last lot before reaching the replacement time of the consumable part 80 is completed based on the updated "next replacement date and time" (step S202). If the processing of the last lot before reaching the replacement time of the consumable part 80 is not completed in the processing device 40 (NO in step S202), the controller 22 executes the processing shown in step S200 again.

On the other hand, if the processing of the last lot before reaching the replacement time of the consumable part 80 is completed in the processing device 40 (YES in step S202) the controller 22 controls the processing device 40 to prepare the replacement of the consumable part 80 (step S203). In preparing the replacement of the consumable part 80, processing such as discharging the processing gas in the chamber 41, cleaning the inside of the chamber 41, and adjusting the pressure in the chamber 41 are performed.

Next, the controller 22 determines whether or not a connection notification is received from the replacement device 50 (step S204). The replacement device 50 starts to move to the position of the processing device 40 having the consumable part 80 that requires replacement by the processing shown in FIG. 21. If the connection notification is not received from the replacement device 50 (NO in step S204), the controller 22 executes the processing shown in step S204 again.

On the other hand, if the connection notification is received from the replacement device 50 (YES in S204), the controller 22 instructs the replacement device 50 such that a gas in the space 90 of the connection portion between the processing device 40 and the replacement device 50 is exhausted (step S205). The controller 558 of the replacement device 50 controls the valve 553a and the exhaust unit 554 to exhaust the gas from the space 90 of the connection portion between the processing device 40 and the replacement device 50.

Next, the controller 22 determines whether or not a pressure P in the processing device 40 has reached a predetermined pressure $P_1$ based on the measurement value of the sensor of the processing device 40 (step S206). If the pressure P in the processing device 40 has not reached the pressure $P_1$ (No in step S206), the controller 22 executes the processing shown in step S206 again.

If the pressure P in the processing device 40 has reached the pressure $P_1$ (YES in step S206), the controller 22 transmits, to the replacement device 50, a gate opening request for requesting an opening of the gate valve 513a (step S207). Then, the controller 22 determines whether or not a gate opening notification indicating the completion of the opening of the gate valve 513a is received from the replacement device 50 (step S208). If the gate opening notification is not received (NO in step S208), the controller 22 executes the processing shown in step S208 again.

On the other hand, if the gate opening notification is received (YES in step S208), the controller 22 controls the processing device 40 to open the gate valve 401 (step S209). Then, the controller 22 transmits, to the replacement device 50, a replacement start instruction for instructing the start of replacement of the consumable part 80 (step S210).

After the replacement start instruction is transmitted in step S210, the replacement of the consumable parts 80 is started by the replacement device 50. At this time, the controller 22 may control the processing device 40 to clean the inside of the chamber 41 between the unloading of the used consumable part 80 and the loading of the unused consumable part 80. Accordingly, when the used consumable part 80 is unloaded, the deposits that are peeled off from the consumable part 80 and fall into the chamber 41 can be removed before the unused consumable part 80 is loaded.

Next, the controller 22 determines whether or not a replacement completion notification indicating the completion of the replacement of the consumable part 80 is received from the replacement device 50 (step S211). If the replacement completion notification is not received from the replacement device 50 (NO in step S211), the controller 22 executes the processing shown in step S211 again.

On the other hand, if the replacement completion notification is received from the replacement device 50 (YES in step S211), the controller 22 controls the processing device 40 to close the gate valve 401 (step S212). Then, the controller 22 transmits a replacement confirmation notification to the replacement device 50 (step S213). Then, the controller 22 controls the replacement device 50 to stop the operation of exhausting the gas from the space 90 of the connection portion between the processing device 40 and the replacement device 50 (step S214). The controller 558 of the replacement device 50 controls the valve 553*a* and the exhaust unit 554 to stop the operation of exhausting the gas from the space 90 of the connection portion between the processing device 40 and the replacement device 50. Then, the controller 22 restores the pressure in the space 90 to the atmospheric pressure.

Next, the controller 22 deletes a record including the "part ID" of the used consumable part 80 that has been replaced with the unused edge ring 80 in the individual table 212 of the management table 210. Then, the controller 22 creates a new record including the "part ID" of the unused consumable part 80 that has been replaced with the used consumable part 80 in the management table 210 (step S215). In the new record, the current date and time are registered in the "replacement date and time" column, and 0 is registered in the "RF integration time" column.

Then, the controller 22 estimates the replacement time of the replaced unused consumable part 80, and registers the estimated replacement time in the "next replacement date and time" of the newly created record (S216). Then, the controller 22 executes the processing shown in step S200 again.

(Processing of the Replacement Device 50)

FIGS. 23 and 24 are flowcharts showing an example of processing of the replacement device 50. The replacement device 50 starts the processing shown in FIGS. 23 and 24, for example, when the control device 20 instructs the replacement device 50 to move to a position of the processing device 40 having the consumable part 80 that requires replacement and the replacement device 50 starts to move to the position of the processing device 40, for example. The processing shown in FIGS. 23 and 24 is realized by executing the program read out from the storage unit 559 under the control of the controller 558.

First, the controller 558 controls the valve 552 and the exhaust unit 554 to start an operation of exhausting a gas from the upper container 510, thereby starting an adjustment of a pressure in the upper container 510 (step S300). Then, the controller 558 determines whether or not the replacement device 50 is connected to the processing device 40 based on a sensing result of the sensor 551 (step S301). If the replacement device 50 is not connected to the processing device 40 (NO in step S301), the controller 558 executes the processing shown in step S301 again.

On the other hand, if the replacement device 50 is connected to the processing device 40 (YES in step S301), the controller 558 determines whether or not the part storage device 60 and the jig storage device 70 are connected to the replacement device 50 (step S302). The controller 558 determines whether or not the part storage device 60 and the jig storage device 70 are connected to the replacement device 50 by determining, e.g., whether or not a connection notification indicating the connection of the replacement device 50 is received from the part storage device 60 and the jig storage device 70. If the part storage device 60 and the jig storage device 70 are not connected to the replacement device 50 (NO in step S302), the controller 558 executes the processing shown in step S302 again.

On the other hand, if the part storage device 60 and the jig storage device 70 are connected to the replacement device 50 (YES in step S302), the controller 558 controls the valve 555 and the gas supply unit 556 to supply an inert gas into the upper container 510. Then, the controller 558 determines whether or not a pressure P in the upper container 510 has reached a predetermined pressure $P_2$ (step S303). In the present embodiment, the pressure $P_2$ is higher than the pressure $P_1$ in the processing device 40 that is adjusted when the consumable part 80 is replaced. If the pressure P in the upper container 510 has not reached the pressure $P_2$ (NO in step S303), the controller 558 executes the processing shown in step S303 again.

On the other hand, if the pressure P in the upper container 510 has reached the pressure $P_2$ (YES in step S303), the controller 558 opens the gate valve 513*b* between the replacement device 50 and the part storage device 60 and the gate valve 513*c* between the replacement device 50 and the jig storage device 70 (step S304). Then, the controller 558 controls the operation robots 52*a* and 52*b* to insert the tip ends of the operation arms 520*a* and 520*b* into the cassette 72 of the jig storage device 70. Then, the controller 558 controls the operation arms 520*a* and 520*b* to equip the end effectors 81 for sensing at the tip ends of the operation arms 520*a* and 520*b* (step S305). Then, the controller 558 transmits a connection notification indicating that the replacement device 50 is connected to the processing device 40 to the control device 20 through the communicator 557 (step S306).

Next, the controller 558 determines whether or not a gate opening request is received from the control device 20 through the communicator 557 (step S307). If the gate opening request is not received (NO in step S307), the controller 558 executes the processing shown in step S307 again. On the other hand, if the gate opening request is received (YES in step S307), the controller 558 opens the gate valve 513*a* between the replacement device 50 and the processing device 40 (step S308).

Next, the controller 558 determines whether or not a replacement start instruction is received from the control device 20 through the communicator 557 (step S309). If the replacement start instruction is not received (NO in step S309), the controller 558 executes the processing shown in step S309 again. On the other hand, if the replacement start instruction is received (YES in step S309), the controller 558 controls the operation arms 520*a* and 520*b* equipped with the end effectors 81 for sensing at the tip ends thereof to sense the inside of the processing device 40 (step S310). In step S309, an acquisition of information indicating the status of the consumable part 80 in the processing device 40, a positional alignment (teaching) of a reference position in the replacement device 50 and a reference position in the processing device 40, and the like are performed.

Next, the controller 558 determines whether or not the replacement of the consumable part 80 specified by the control device 20 can be performed based on the sensing result in step S309 (step S311). If it is determined that the replacement of the consumable part 80 cannot be performed due to a large amount of deposits adhered to the consumable part 80 or a deformation of the consumable part 80 (NO in step S311), the controller 558 notifies an error to the control device 20 through the communicator 557 (step S312). Then, the processing of the flowchart shown in FIGS. 23 and 24 is completed. When the error is notified, the control device 20 notifies an operator of the manufacturing system 10 of the error. The operator instructs a worker to manually replace the consumable part 80. Further, when the error is notified from the control device 20, the operator may acquire the sensing result from the replacement device 50. Then, the operator may execute the replacement operation of the consumable part 80 by remotely controlling the operation robots 52a and 52b and the transfer robot 53 based on the sensing result.

On the other hand, if it is determined that the replacement of the consumable part 80 can be performed (YES in step S311), the controller 558 controls the operation robots 52a and 52b to remove the end effectors 81 for sensing from the tip ends of the operation arms 520a and 520b. Then, the controller 558 attaches the end effectors 81 for installing or separating the consumable part 80 to or from the tip ends of the operation arms 520a and 520b (step S312 in FIG. 24). Then, the controller 558 controls the transfer robot 53 to attach the holding member 82 to the tip end of the transfer arm 530 (step S313).

Next, the controller 558 inserts the tip ends of the operation arms 520a and 520b into the processing device 40, and controls the operation arms 520a and 520b having the end effectors 81 attached to the tip ends thereof to separate the used consumable part 80 (step S314).

Next, the controller 558 controls the transfer robot 53 to insert the holding member 82 at the tip end of the transfer arm 530 to a position below the consumable part 80 separated by the operation arms 520a and 520b. Then, the controller 558 controls the operation robots 52a and 52b such that the separated consumable part 80 is held on the holding member 82. Then, the controller 558 controls the transfer robot 53 to unload the used consumable part 80 from the processing device 40 (step S315). Then, the controller 558 controls the transfer robot 53 to accommodate the used consumable part 80 in the cassette 62 of the part storage device 60.

Next, the controller 558 controls the transfer robot 53 to extract an unused consumable part 80 from the cassette 62 of the part storage device 60 and load it into the processing device 40 (step S316). Then, the controller 558 controls the operation robots 52a and 52b to lift the unused consumable part 80 held by the holding member 82. Then, the controller 558 controls the transfer robot 53 to retract the transfer arm 530 from the processing device 40. Then, the controller 558 controls the operation robots 52a and 52b to install the unused consumable part 80 (step S317). Then, the controller 558 controls the operation robots 52a and 52b to retract the operation arms 520a and 520b from the processing device 40.

Next, the controller 558 closes the gate valves 513a, 513b, and 513c (step S318). Then, the controller 558 controls the valve 552 and the exhaust unit 554 to stop the operation of exhausting the gas from the upper container 510, and controls the valve 555 and the gas supply unit 556 to stop the supply of the inert gas into the upper container 510. In addition, the controller 558 controls the valves 553a, 553b, and 553c to stop the operation of exhausting the gas from the connection portions connecting with the replacement device 50. Then, the controller 558 transmits a replacement completion notification indicating that the completion of the replacement of the consumable parts 80 to the control device 20, the part storage device 60, and the jig storage device 70 through the communicator 557 (step S319). Then, the processing of the flowchart shown in FIGS. 23 and 24 is completed.

(Processing of the Part Storage Device 60)

FIG. 25 is a flowchart showing an example of the processing of the part storage device 60. The part storage device 60 starts the processing shown in FIG. 25, for example, when the control device 20 instructs the part storage device 60 to move to a position of the processing device 40 having the consumable parts 80 that require replacement and the part storage device 60 starts to move to the position of the processing device 40. The processing shown in FIG. 25 is realized by executing the program read out from the storage unit 657 under the control of the controller 656.

First, the controller 656 controls the valve 651 and the exhaust unit 652 to start an operation of exhausting a gas from the upper container 610, thereby starting an adjustment of a pressure in the upper container 610 (step S400). Then, the controller 656 determines whether or not the part storage device 60 is connected to the replacement device 50 based on a sensing result of the sensor 650 (step S401). If the part storage device 60 is not connected to the replacement device 50 (NO in step S401), the controller 656 executes the processing shown in step S401 again.

On the other hand, if the part storage device 60 is connected to the replacement device 50 (YES in step S401), the controller 656 transmits, to the replacement device 50, a connection notification indicating that the part storage device 60 is connected to the replacement device 50 (step S402). Then, the controller 656 controls the valve 653 and the gas supply unit 654 to supply the inert gas into the upper container 610. Then, the controller 656 determines whether or not a pressure P in the upper container 610 has reached a predetermined pressure $P_3$ (step S403). In the present embodiment, the pressure $P_3$ is higher than the pressure $P_2$ in the replacement device 50 that is adjusted when the consumable part 80 is replaced. If the pressure P in the upper container 610 has not reached the pressure $P_3$ (NO in step S403), the controller 656 executes the processing shown in step S403 again.

On the other hand, if the pressure P in the upper container 610 has reached the pressure $P_3$ (YES in step S403), the controller 656 opens the gate valve 613 (step S404). Then, the controller 656 controls the driving unit 64 to vertically move the cassette 62 in response to the loading of the used consumable part 80 and the unloading of the unused consumable part 80 using the transfer robot 53 of the replacement device 50 (step S405).

Next, the controller 656 determines whether or not a replacement completion notification is received from the replacement device 50 through the communicator 655 (step S406) If the replacement completion notification is not received (NO in step S406), the controller 656 executes the processing shown in step S405 again. On the other hand, if the replacement completion notification is received (YES in step S406), the controller 656 closes the gate valve 613 (step S407). Then, the controller 656 controls the valve 651 and the exhaust unit 652 to stop the operation of exhausting the gas from the upper container 610, and controls the valve 653 and the gas supply unit 654 to stop the supply of the inert gas into the upper container 610. Then, the processing of the flowchart shown in FIG. 25 is completed.

(Processing of the Jig Storage Device 70)

The processing of the jig storage device 70 will be described with reference to FIG. 25. The jig storage device 70 starts the processing shown in FIG. 25, for example, when the control device 20 instructs the jig storage device 70 to move to a position of the processing device 40 having the consumable part 80 that requires replacement, and the jig storage device 70 starts to move to the position of the processing device 40. The processing shown in FIG. 25 is realized by executing the program read out from the storage unit 757 under the control of the controller 756.

First, the controller 756 controls the valve 751 and the exhaust unit 752 to start an operation of exhausting a gas from the upper container 710, thereby starting an adjustment of a pressure in the upper container 710 (step S400). Then, the controller 756 determines whether or not the jig storage device 70 is connected to the replacement device 50 based on a sensing result of the sensor 750 (step S401). If the jig storage device 70 is not connected to the replacement device 50 (NO in step S401), the controller 756 executes the processing shown in step S401 again.

On the other hand, if the jig storage device 70 is connected to the replacement device 50 (YES in step S401), the controller 756 transmits, to the replacement device 50, a connection notification indicating that the jig storage device 70 is connected to the replacement device 50 (step S402). Then, the controller 756 controls the valve 753 and the gas supply unit 754 to supply the inert gas into the upper container 710. Then, the controller 756 determines whether or not a pressure P in the upper container 710 has reached a predetermined pressure $P_3$ (step S403). If the pressure P in the upper container 710 has not reached the pressure $P_3$ (NO in step S403), the controller 756 executes the processing shown in step S403 again.

On the other hand, if the pressure P in the upper container 710 has reached the pressure $P_3$ (YES in step S403), the controller 756 opens the gate valve 713 (step S404). Then, the controller 756 controls the driving unit 74 to vertically move the cassette 72 in response to the loading/unloading of the end effectors 81 and the holding member 82 using the transfer robot 53 of the replacement device 50 (step S405).

Next, the controller 756 determines whether or not a replacement completion notification is received from the replacement device 50 through the communicator 755 (step S406). If the replacement completion notification is not received (NO in step S406), the controller 756 executes the processing shown in step S405 again. On the other hand, if the replacement completion notification is received (YES in step S406), the controller 756 closes the gate valve 713 (step S407). Then, the controller 756 controls the valve 751 and the exhaust unit 752 to stop the operation of exhausting the gas from the upper container 710, and controls the valve 753 and the gas supply unit 754 to stop the supply of the inert gas into the upper container 710. Then, the processing of the flowchart shown in FIG. 25 is completed.

The exemplary embodiment has been described. As described above, in the above-described embodiment, the manufacturing system 10 for replacing the consumable part 80 includes the replacement device 50 and the part storage device 60. The part storage device 60 is configured to store the unused consumable parts 80. The replacement device 50 is connected to the processing device 40 and the part storage device 60, and is configured to replace the used consumable part 80 in the processing device 40 with the unused consumable part 80 in the part storage device 60. Further, the replacement device 50 is moved to the position of the processing device 40 having the consumable part 80 that requires replacement, and then is connected to the processing device 40. Further, the part storage device 60 is moved to the position of the replacement device 50 connected to the processing device 40 having the consumable part 80 that requires replacement, and then is connected to the replacement device 50. Accordingly, the installation area of the semiconductor device manufacturing system 10 can be reduced.

Further, in the above-described embodiment, the replacement device 50 includes the operation robot 52 and the transfer robot 53. The transfer robot 53 transfers the consumable part 80 between the processing device 40 and the part storage device 60 through the replacement device 50. The operation robot 52 separates the used consumable part 80 and places the separated used consumable part 80 on the transfer robot 53 to be removed from the processing device 40, and further installs the unused consumable part 80 placed on the transfer robot 53 in the processing device 40. Accordingly, the used consumable part 80 and the unused consumable part 80 can be replaced with each other.

Further, in the above-described embodiment, the manufacturing system 10 further includes the jig storage device 70. The jig storage device 70 is configured to store the end effector 81 to be attached to the tip end of the operation robot 52, is a self-propelled device that moves to the position of the replacement device 50 connected to the processing device 40 having the consumable part 80 that requires replacement, and is connected to the replacement device 50. The operation robot 52 extracts the end effector 81 used for replacing the consumable part 80 that requires replacement from the jig storage device 70 and equips the end effector 81. The operation robot 52 replaces the consumable part 80 that requires replacement using the end effector 81 attached thereto. By replacing the end effector 81 attached to the tip end of the operation robot 52, different types of consumable parts 80 can be replaced by one operation robot 52.

Further, in the above-described embodiment, the end effector 81 includes the sensor. Before the consumable part 80 is replaced, the operation robot 52 senses the inner state of the processing device 40 using the sensor attached to the tip end of the operation robot 52. The replacement device 50 includes the controller 558 that determines whether or not the replacement of the consumable part 80 can be performed based on the sensing result from the operation robot 52, replaces the consumable part 80 if it is determined that the replacement of the consumable part 80 can be performed and notifies the operator of the determination if it is determined that the replacement of the consumable part 80 cannot be performed. Accordingly, the consumable part 80 can be replaced.

Further, in the above-described embodiment, the jig storage device 70 is configured to store the holding member 82 to be attached to the tip end of the transfer robot 53. The transfer robot 53 extracts the holding member 82 suitable for the replacement of the consumable part 80 that requires replacement from the jig storage device 70 and equips the holding member 82. The transfer robot 53 transfers the consumable part 80 that requires replacement using the holding member 82 attached thereto. By replacing the holding member 82 attached to the tip end of the transfer robot 53, different types of consumable parts 80 can be replaced by one transfer robot 53.

Further, in the above-described embodiment, the part storage device 60 is configured to store different types of unused consumable parts 80 and one or more of each type of unused consumable parts 80 are stored. Accordingly, the consumable part 80 can be replaced quickly.

Further, in the above-described embodiment, the replacement device 50 includes the valve 555 that controls the pressure in the replacement device 50. The valve 555 controls the pressure in the replacement device 50 to be higher than the pressure in the processing device 40 when the used consumable part 80 in the processing device 40 is replaced. Accordingly, it is possible to suppress the intrusion of the particles in the processing device 40 into the replacement device 50.

Further, in the above-described embodiment, the replacement device 50 includes the mover 56, the sensor 551, and the controller 558, and the part storage device 60 includes the mover 66, the sensor 650, and the controller 656. The mover 56 has the power source and moves the replacement device 50. The sensor 551 senses the surroundings of the replacement device 50. The controller 558 controls the mover 56 based on the sensing result of the sensor 551 to move the replacement device 50 to the position of the processing device 40 having the consumable part 80 that requires replacement. The mover 66 has the power source and moves the part storage device 60. The sensor 650 senses the surroundings of the part storage device 60. The controller 656 controls the mover 66 based on the sensation result of the sensor 650 to move the part storage device 60 to the position of the replacement device 50 connected to the processing device 40 having the consumable part 80 that requires replacement. Accordingly, the replacement device 50 and the part storage device 60 can be moved independently.

Further, in the above-described embodiment, the replacement device 50 for replacing the consumable part 80 includes the openings 512a and 512b, the transfer robot 53, and the mover 56. The opening 512a is connected to the processing device 40 through the gate valve 513a. The opening 512b is connected to the part storage device 60 storing the unused consumable part 80 through the gate valve 513b. The operation robot 52 replaces the used consumable part 80 in the processing device 40 with the unused consumable part 80 in the part storage device 60. The mover 56 moves the replacement device 50 to the position of the processing device 40 having the consumable part 80 that requires replacement. Further, the replacement device 50 and the part storage device 60 can be moved independently. Accordingly, the installation area of the semiconductor device manufacturing system 10 can be reduced.

(Other Applications)

The technique of the present disclosure is not limited to the above-described embodiment, and can be variously modified within the scope of the gist of the present disclosure.

For example, in the above-described embodiment, different types of the consumable parts 80 are accommodated in the cassette 62 of the part storage device 60, but the present disclosure is not limited thereto. In an alternative embodiment, the same type of multiple consumable parts 80 may be accommodated in the cassette 62. Further, the part storage device 60 may be prepared for each type of the consumable part 80 accommodated in the cassette 62. Therefore, the consumable parts 80 having substantially the same replacement cycle are accommodated in the cassette 62, and unnecessary opening of the gate valve 613 of the part storage device 60 is prevented. Accordingly, it is possible to suppress the adhesion of particles to the unused consumable part 80 in the cassette 62.

Further, in the above-described embodiment, the operation robot 52 and the transfer robot 53 of the replacement device 50 come into contact with the unused consumable part 80 and the used consumable part 80. However, the present disclosure is not limited thereto. In an alternative embodiment, in the replacement device 50, the operation robot 52 and the transfer robot 53 to be in contact with the unused consumable part 80 and the operation robot 52 and the transfer robot 53 to be in contact with the used consumable part 80 may be provided separately. Accordingly, it is possible to prevent deposits peeled off from the used consumable part 80 from being adhered as particles to the unused consumable part 80 by the operation robot 52 or the transfer robot 53.

Further, in the above-described embodiment, the unused consumable parts 80 and the used consumable parts 80 are accommodated in the cassette 62 of the part storage device 60. However, the present disclosure is not limited thereto. In an alternative embodiment, the space in the cassette 62 may be divided into a space where the unused consumable parts 80 are accommodated and a space where the used consumable parts 80 are accommodated. Accordingly, it is possible to prevent deposits peeled off from the used consumable part 80 from being adhered as particles to the unused consumable part 80.

Further, in the above-described embodiment, the replacement device 50, the part storage device 60, and the jig storage device 70 start the operation of exhausting the device after an instruction is received from the control device 20. However, the present disclosure is not limited thereto. For example, the replacement device 50, the part storage device 60, and the jig collecting device 70 may perform the exhaust operation such that the pressure in the device becomes a predetermined pressure P even before the instruction is received from the control device 20. Hence, the replacement of the consumable part 80 can be started more quickly.

Further, in the replacement device 50, the part storage device 60, and the jig storage device 70 of the above-described embodiment, the gas exhausted by the exhaust unit is discharged to the outside of each device. However, the present disclosure is not limited thereto. For example, each device may be connected to a gas processing unit that is disposed outside each device to process an exhaust gas through a flexible hose, and the gas exhausted from each device may be sent to the gas processing unit. Accordingly, the recycling of the gas exhausted from each device is facilitated.

Further, in the replacement device 50, the part storage device 60, and the jig storage device 70 of the above-described embodiment, the gas in each device is exhausted by the exhaust unit in the corresponding device. However, the present disclosure is not limited thereto. For example, each device may be connected to an exhaust unit disposed outside each device through a flexible hose, and the gas in each device may be exhausted by the corresponding exhaust unit. Accordingly, the replacement device 50, the part storage device 60, and the jig storage device 70 can be scaled down in size.

Further, in the above-described embodiment, the used consumable part 80 is unloaded from the processing device 40 and the unused consumable part 80 is loaded into the processing device 40 by the same replacement device 50. However, the present disclosure is not limited thereto. For example, the replacement device 50 for unloading the used consumable part 80 from the processing device 40 and the replacement device 50 for loading the unused consumable part 80 into the processing device 40 may be separately provided. Accordingly, it is possible to prevent deposits peeled off from the used consumable part from being adhered as particles to the unused consumable part 80.

Further, in the above-described embodiment, the replacement device 50 for loading the unused consumable part 80 into the processing device 40 may be connected to the vacuum transfer chamber 31 or the atmosphere transfer chamber 33. The replacement device 50 connected to the vacuum transfer chamber 31 transfers the unused consumable part 80 to the robot arm 310 in the vacuum transfer chamber 31. The robot arm 310 loads the received unused consumable part 80 into the processing device 40 having the consumable part 80 that requires replacement. Further, the replacement device 50 connected to the atmospheric transfer chamber 33 transfers the unused consumable part 80 to the robot arm 330 in the atmospheric transfer chamber 33. The robot arm 330 loads the unused consumable part 80 into the load-lock chamber 32. The unused consumable part 80 loaded into the load-lock chamber 32 is loaded into the processing device 40 having the consumable part 80 that requires replacement by the robot arm 310 in the vacuum transfer chamber 31. When the replacement device 50 is connected to the atmospheric transfer chamber 33, it is not necessary to provide the exhaust unit in each of the replacement device 50, the part storage device 60, and the jig storage device 70, which makes it possible to scale down each device in size.

Further, in the above-described embodiments, when the replacement device 50 is connected to the processing device 40, the battery in the mover 56 may be charged by the power supplied from the processing device 40. Further, the batteries in the mover 66 and the mover 76 of the part storage device 60 and the jig storage device 70 may be charged through the replacement device 50 connected to the processing device 40.

The presently disclosed embodiments are considered in all respect to be illustrative and not restrictive. The above-described embodiments can be embodied in various forms. Further, the above-described embodiments may be omitted, replaced, or changed in various forms without departing from the scope of the appended claims and the gist thereof.

The invention claimed is:

1. A part replacement system, the system comprising:
a mobile part container configured to store a part;
a mobile robot housing connectable to a processing chamber and the mobile part container, the mobile robot housing including a robot being configured to replace a part to be replaced installed in the processing chamber with the part stored in the mobile part container; and
a control circuit configured to
instruct the mobile robot housing to connect to the processing chamber having the part to be replaced, and
instruct the mobile part container to connect to the mobile robot housing.

2. The part replacement system of claim 1, wherein the robot further includes:
a transfer arm configured to transfer the part and the part to be replaced between the processing chamber and the mobile part container through the mobile robot housing; and
an operation arm configured to remove the part to be replaced and place the part to be replaced onto the transfer arm to be removed from the processing chamber, the operation arm being further configured to install the part placed on the transfer arm in the processing chamber.

3. The part replacement system of claim 2, further comprising a mobile jig storage container configured to store an end effector to be attached to a tip end of the operation arm, wherein the control circuit is configured to:
instruct the mobile jig storage container to connect to the mobile robot housing; and
instruct the mobile robot housing to control the operation arm to extract the end effector used for replacing the part to be replaced, attach the end effector to the tip end of the operation arm, and replace the part to be replaced by using the end effector.

4. The part replacement system of claim 3, wherein
the end effector includes a sensor,
the operation arm is configured to sense an inner state of the processing chamber by using the sensor attached to the tip end thereof before replacing the part to be replaced,
the mobile robot housing includes an arm circuit configured to determine whether or not the part to be replaced is replaceable based on a sensing result from the operation arm, and
if it is determined that the part to be replaced is replaceable, the arm circuit is configured to control the operation arm to replace the part to be replaced, and if it is determined that the part to be replaced is not replaceable, the arm circuit is configured to notify an operator of a determination result.

5. The part replacement system of claim 4, wherein
the mobile jig storage container is further configured to store a mount to be attached to the tip end of the transfer arm, and
the arm circuit is further configured to control the transfer arm to extract the mount and transfer the part to be replaced by using the extracted mount.

6. The part replacement system of claim 3, wherein
the mobile jig storage container is further configured to store a mount to be attached to the tip end of the transfer arm,
the mobile robot housing includes an arm circuit configured to control the transfer arm to extract the mount and transfer the part to be replaced by using the extracted mount.

7. The part replacement system of claim 3, wherein the mobile part container is configured to store a plurality of types of parts, the part being one type of the plurality of types of parts, wherein one or more of each type are stored.

8. The part replacement system of claim 3, wherein the mobile part container is configured to store a plurality of parts of a same type of the part.

9. The part replacement system of claim 3, wherein
the mobile robot housing includes a valve configured to control a pressure in the mobile robot housing; and
the valve is configured to control the pressure in the mobile robot housing to be higher than a pressure in the processing chamber when the part to be replaced installed in the processing chamber is replaced.

10. The part replacement system of claim 3, wherein the mobile robot housing includes:
a first power source configured to move the mobile robot housing;
a first sensor configured to sense the surrounding of the mobile robot housing; and
a first mobile control circuit configured to control the first power source based on a sensing result of the first sensor to move the mobile robot housing to a position of the processing chamber having the part to be replaced that requires the robot.

11. The part replacement system of claim 3, wherein the mobile part container includes:
a second power source configured to move the mobile part container;
a second sensor configured to sense the surrounding of the mobile part container; and
a second mobile control circuit configured to control the second power source based on a sensing result of the second sensor to move the mobile part container to a position of the mobile robot housing.

12. The part replacement system of claim 1, wherein the mobile part container is configured to store a plurality of types of parts, the part being one type of the plurality of types of parts, wherein one or more of each type are stored.

13. The part replacement system of claim 1, wherein the mobile part container is configured to store a plurality of parts of a same type of the part.

14. The part replacement system of claim 1, wherein
the mobile robot housing includes a valve configured to control a pressure in the mobile robot housing; and
the valve is configured to control the pressure in the mobile robot housing to be higher than a pressure in the processing chamber when the part to be replaced installed in the processing chamber is replaced.

15. The part replacement system of claim 1, wherein the mobile robot housing includes:
a first power source configured to move the mobile robot housing;
a first sensor configured to sense the surrounding of the mobile robot housing; and
a first mobile control circuit configured to control the first power source based on a sensing result of the first sensor to move the mobile robot housing to a position of the processing chamber having the part to be replaced that requires the robot.

16. The part replacement system of claim 1, wherein the mobile part container includes:
a second power source configured to move the mobile part container;
a second sensor configured to sense the surrounding of the mobile part container; and
a second mobile control circuit configured to control the second power source based on a sensing result of the second sensor to move the mobile part container to a position of the mobile robot housing.

17. The part replacement system of claim 1, wherein the mobile robot housing includes:
an upper container housing the robot; and
a lower container housing a gas supply configured to control a pressure of the upper container.

18. The part replacement system of claim 1, wherein the mobile robot housing includes:
a first gate on a first side of the mobile robot housing to be open to retrieve a part from the mobile part container when connected to the mobile part container; and
a second gate on a second side of the mobile robot housing to be opened to replace the part in the processing chamber when connected to the processing chamber.

* * * * *